(12) United States Patent
Maharyta

(10) Patent No.: US 8,692,563 B1
(45) Date of Patent: Apr. 8, 2014

(54) METHODS AND CIRCUITS FOR MEASURING MUTUAL AND SELF CAPACITANCE

(71) Applicant: Cypress Semiconductor Corporation, San Jose, CA (US)

(72) Inventor: Andriy Maharyta, Lviv (UA)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/720,861

(22) Filed: Dec. 19, 2012

Related U.S. Application Data

(63) Continuation of application No. 12/395,462, filed on Feb. 27, 2009, now Pat. No. 8,358,142.

(60) Provisional application No. 61/067,539, filed on Feb. 27, 2008.

(51) Int. Cl.
| G01R 27/26 | (2006.01) |
| G06F 3/041 | (2006.01) |
| G06F 3/045 | (2006.01) |

(52) U.S. Cl.
USPC ............ 324/658; 324/686; 345/173; 345/174

(58) Field of Classification Search
USPC ............ 324/658, 649, 600, 686, 519; 702/47, 702/52; 340/562, 545.4; 73/335.04, 304 C, 73/514.32, 718, 724, 780, 862.337, 73/862.626
See application file for complete search history.

(56) References Cited

U.S. PATENT DOCUMENTS

| | | |
|---|---|---|
| 3,660,801 A | 5/1972 | Paulfus |
| 3,921,167 A | 11/1975 | Fox |
| 3,979,745 A | 9/1976 | Bishop |
| 4,039,940 A | 8/1977 | Butler et al. |
| 4,090,092 A | 5/1978 | Serrano |
| 4,103,252 A | 7/1978 | Bobick |
| 4,113,378 A | 9/1978 | Wirtz |
| 4,145,748 A | 3/1979 | Eichelberger et al. |
| 4,193,063 A | 3/1980 | Hitt et al. |
| 4,238,711 A | 12/1980 | Wallot |
| 4,264,903 A | 4/1981 | Bigelow |
| 4,266,144 A | 5/1981 | Bristol |
| 4,283,713 A | 8/1981 | Philipp |

(Continued)

FOREIGN PATENT DOCUMENTS

| EP | 0574213 A | 12/1993 |
| GB | 05000604 B2 | 2/2005 |

(Continued)

OTHER PUBLICATIONS

U.S. Appl. No. 12/166,228 "Capacitance to Frequency Converter," Andriy Maharyta et al., filed Jul. 1, 2008; 29 pages.
U.S. Appl. No. 60/947,871 "Capacitance to Frequency Converter," Andrey Maharita et al., filed Jul. 3, 2007; 21 pages.
USPTO Advisory Action for U.S. Appl. No. 12/395,969 dated Sep. 21, 2012; 3 pages.
USPTO Final Rejection for U.S. Appl. No. 12/395,969 dated Jul. 17, 2012; 25 pages.
USPTO Non-Final Rejection for U.S. Appl. No. 12/166,228 dated Aug. 11, 2010; 8 pages.
USPTO Non-Final Rejection for U.S. Appl. No. 12/199,228 dated Dec. 30, 2009; 11 pages.

(Continued)

*Primary Examiner* — Hoai-An D Nguyen

(57) ABSTRACT

In an example embodiment, an apparatus includes a sensing device. The sensing device includes circuitry configured to sense self-capacitance and circuitry configured to sense mutual-capacitance, each configured to detect capacitance values corresponding to whether an object is proximate to a touch screen. The sensing device is configured to measure a first capacitance value using the self-capacitance circuitry during self-capacitance sensing operations and to measure a second capacitance value using the mutual-capacitance circuitry during mutual-capacitance sensing operations.

30 Claims, 17 Drawing Sheets

(56) References Cited

U.S. PATENT DOCUMENTS

| | | |
|---|---|---|
| 4,292,604 A | 9/1981 | Embree et al. |
| 4,293,734 A | 10/1981 | Pepper, Jr. |
| 4,305,135 A | 12/1981 | Dahl et al. |
| 4,438,404 A | 3/1984 | Philipp |
| 4,475,151 A | 10/1984 | Philipp |
| 4,497,575 A | 2/1985 | Philipp |
| 4,558,274 A | 12/1985 | Carusillo |
| 4,560,830 A | 12/1985 | Perl |
| 4,586,260 A | 5/1986 | Baxter et al. |
| 4,614,937 A | 9/1986 | Poujois |
| 4,728,932 A | 3/1988 | Atherton |
| 4,736,097 A | 4/1988 | Philipp |
| 4,736,191 A | 4/1988 | Matzke et al. |
| 4,742,331 A | 5/1988 | Barrow et al. |
| 4,772,983 A | 9/1988 | Kerber et al. |
| 4,773,024 A | 9/1988 | Faggin et al. |
| 4,802,103 A | 1/1989 | Faggin et al. |
| 4,825,147 A | 4/1989 | Cook et al. |
| 4,831,325 A | 5/1989 | Watson, Jr. |
| 4,876,534 A | 10/1989 | Mead et al. |
| 4,878,013 A | 10/1989 | Andermo |
| 4,879,461 A | 11/1989 | Philipp |
| 4,879,505 A | 11/1989 | Barrow et al. |
| 4,879,508 A | 11/1989 | Andermo |
| 4,920,399 A | 4/1990 | Hall |
| 4,935,702 A | 6/1990 | Mead et al. |
| 4,940,980 A | 7/1990 | Tice |
| 4,953,928 A | 9/1990 | Anderson et al. |
| 4,962,342 A | 10/1990 | Mead et al. |
| 4,977,480 A | 12/1990 | Nishihara |
| 5,008,497 A | 4/1991 | Asher |
| 5,049,758 A | 9/1991 | Mead et al. |
| 5,055,827 A | 10/1991 | Philipp |
| 5,059,920 A | 10/1991 | Anderson et al. |
| 5,068,622 A | 11/1991 | Mead et al. |
| 5,073,759 A | 12/1991 | Mead et al. |
| 5,083,044 A | 1/1992 | Mead et al. |
| 5,089,757 A | 2/1992 | Wilson |
| 5,095,284 A | 3/1992 | Mead |
| 5,097,305 A | 3/1992 | Mead et al. |
| 5,107,149 A | 4/1992 | Platt et al. |
| 5,109,261 A | 4/1992 | Mead et al. |
| 5,119,038 A | 6/1992 | Anderson et al. |
| 5,120,996 A | 6/1992 | Mead et al. |
| 5,122,800 A | 6/1992 | Philipp |
| 5,126,685 A | 6/1992 | Platt et al. |
| 5,146,106 A | 9/1992 | Anderson et al. |
| 5,160,899 A | 11/1992 | Anderson et al. |
| 5,165,054 A | 11/1992 | Platt et al. |
| 5,166,562 A | 11/1992 | Allen et al. |
| 5,204,549 A | 4/1993 | Platt et al. |
| 5,214,388 A | 5/1993 | Vranish et al. |
| 5,237,879 A | 8/1993 | Speeter |
| 5,243,554 A | 9/1993 | Allen et al. |
| 5,248,873 A | 9/1993 | Allen et al. |
| 5,260,592 A | 11/1993 | Mead et al. |
| 5,270,963 A | 12/1993 | Allen et al. |
| 5,276,407 A | 1/1994 | Mead et al. |
| 5,281,862 A | 1/1994 | Ma |
| 5,289,023 A | 2/1994 | Mead |
| 5,294,889 A | 3/1994 | Heep et al. |
| 5,303,329 A | 4/1994 | Mead et al. |
| 5,305,017 A | 4/1994 | Gerpheide |
| 5,323,158 A | 6/1994 | Ferguson, Jr. |
| 5,324,958 A | 6/1994 | Mead et al. |
| 5,331,215 A | 7/1994 | Allen et al. |
| 5,336,936 A | 8/1994 | Allen et al. |
| 5,339,213 A | 8/1994 | O'Callaghan |
| 5,349,303 A | 9/1994 | Gerpheide |
| 5,373,245 A | 12/1994 | Vranish et al. |
| 5,374,787 A | 12/1994 | Miller et al. |
| 5,381,515 A | 1/1995 | Platt et al. |
| 5,384,467 A | 1/1995 | Plimon et al. |
| 5,386,219 A | 1/1995 | Greanias et al. |
| 5,408,194 A | 4/1995 | Steinbach et al. |
| 5,412,387 A | 5/1995 | Vincelette et al. |
| 5,424,756 A | 6/1995 | Ho et al. |
| 5,461,321 A | 10/1995 | Sanders et al. |
| 5,479,103 A | 12/1995 | Kernahan et al. |
| 5,488,204 A | 1/1996 | Mead et al. |
| 5,495,077 A | 2/1996 | Miller et al. |
| 5,518,078 A | 5/1996 | Tsujioka et al. |
| 5,525,980 A | 6/1996 | Jahier et al. |
| 5,541,580 A | 7/1996 | Gerston et al. |
| 5,541,878 A | 7/1996 | Lemoncheck et al. |
| 5,543,588 A | 8/1996 | Bisset et al. |
| 5,543,590 A | 8/1996 | Gillespie et al. |
| 5,543,591 A | 8/1996 | Gillespie et al. |
| 5,555,907 A | 9/1996 | Philipp |
| 5,565,658 A | 10/1996 | Gerpheide et al. |
| 5,566,702 A | 10/1996 | Philipp |
| 5,572,205 A | 11/1996 | Caldwell et al. |
| 5,589,856 A | 12/1996 | Stein et al. |
| 5,629,891 A | 5/1997 | Lemoncheck et al. |
| 5,648,642 A | 7/1997 | Miller et al. |
| 5,650,597 A | 7/1997 | Redmayne |
| 5,670,915 A | 9/1997 | Cooper et al. |
| 5,672,959 A | 9/1997 | Der |
| 5,680,070 A | 10/1997 | Anderson et al. |
| 5,682,032 A | 10/1997 | Philipp |
| 5,684,487 A | 11/1997 | Timko |
| 5,691,513 A | 11/1997 | Yamamoto et al. |
| 5,694,063 A | 12/1997 | Burlison et al. |
| 5,730,165 A | 3/1998 | Philipp |
| 5,748,185 A | 5/1998 | Stephan et al. |
| 5,757,368 A | 5/1998 | Gerpheide et al. |
| 5,760,852 A | 6/1998 | Wu et al. |
| 5,763,909 A | 6/1998 | Mead et al. |
| 5,763,924 A | 6/1998 | Lum et al. |
| 5,767,457 A | 6/1998 | Gerpheide et al. |
| 5,796,183 A | 8/1998 | Hourmand et al. |
| 5,801,340 A | 9/1998 | Peter |
| 5,812,698 A | 9/1998 | Platt et al. |
| 5,844,256 A | 12/1998 | Higashino |
| 5,844,265 A | 12/1998 | Mead et al. |
| 5,854,625 A | 12/1998 | Frisch et al. |
| 5,861,583 A | 1/1999 | Schediwy et al. |
| 5,861,875 A | 1/1999 | Gerpheide |
| 5,864,242 A | 1/1999 | Allen et al. |
| 5,864,392 A | 1/1999 | Winklhofer et al. |
| 5,880,411 A | 3/1999 | Gillespie et al. |
| 5,889,236 A | 3/1999 | Gillespie et al. |
| 5,905,489 A | 5/1999 | Takahama et al. |
| 5,914,465 A | 6/1999 | Allen et al. |
| 5,914,708 A | 6/1999 | Lagrange et al. |
| 5,920,309 A | 7/1999 | Bisset et al. |
| 5,920,310 A | 7/1999 | Faggin et al. |
| 5,926,566 A | 7/1999 | Wang et al. |
| 5,942,733 A | 8/1999 | Allen et al. |
| 5,943,052 A | 8/1999 | Allen et al. |
| 5,949,264 A | 9/1999 | Lo |
| 5,969,513 A | 10/1999 | Clark |
| 6,023,422 A | 2/2000 | Allen et al. |
| 6,028,271 A | 2/2000 | Gillespie et al. |
| 6,028,959 A | 2/2000 | Wang et al. |
| 6,037,929 A | 3/2000 | Ogura et al. |
| 6,037,930 A | 3/2000 | Wolfe et al. |
| 6,060,957 A | 5/2000 | Kodrnja et al. |
| 6,067,019 A | 5/2000 | Scott |
| 6,097,432 A | 8/2000 | Mead et al. |
| 6,140,853 A | 10/2000 | Lo |
| 6,145,850 A | 11/2000 | Rehm |
| 6,148,104 A | 11/2000 | Wang et al. |
| 6,184,871 B1 | 2/2001 | Teres et al. |
| 6,185,450 B1 | 2/2001 | Seguine et al. |
| 6,188,228 B1 | 2/2001 | Philipp |
| 6,188,391 B1 | 2/2001 | Seely et al. |
| 6,191,723 B1 | 2/2001 | Lewis |
| 6,222,528 B1 | 4/2001 | Gerpheide et al. |
| 6,239,389 B1 | 5/2001 | Allen et al. |
| 6,249,447 B1 | 6/2001 | Boylan et al. |
| 6,262,717 B1 | 7/2001 | Donohue et al. |
| 6,271,719 B1 | 8/2001 | Sevastopoulos |
| 6,271,720 B1 | 8/2001 | Sevastopoulos |

(56) References Cited

U.S. PATENT DOCUMENTS

| | | |
|---|---|---|
| 6,271,835 B1 | 8/2001 | Hoeksma |
| 6,278,283 B1 | 8/2001 | Tsugai |
| 6,280,391 B1 | 8/2001 | Olson et al. |
| 6,288,707 B1 | 9/2001 | Philipp |
| 6,295,052 B1 | 9/2001 | Kato et al. |
| 6,304,014 B1 | 10/2001 | England et al. |
| 6,320,184 B1 | 11/2001 | Winklhofer et al. |
| 6,323,846 B1 | 11/2001 | Westerman et al. |
| 6,326,859 B1 | 12/2001 | Goldman et al. |
| 6,342,817 B1 | 1/2002 | Crofts et al. |
| 6,344,773 B1 | 2/2002 | Sevastopoulos et al. |
| 6,353,200 B1 | 3/2002 | Schwankhart |
| 6,366,099 B1 | 4/2002 | Reddi |
| 6,377,009 B1 | 4/2002 | Philipp |
| 6,377,129 B1 | 4/2002 | Rhee et al. |
| 6,380,929 B1 | 4/2002 | Platt |
| 6,380,931 B1 | 4/2002 | Gillespie et al. |
| 6,400,217 B1 | 6/2002 | Bhandari |
| 6,414,671 B1 | 7/2002 | Gillespie et al. |
| 6,424,338 B1 | 7/2002 | Anderson |
| 6,430,305 B1 | 8/2002 | Decker |
| 6,441,073 B1 | 8/2002 | Tanaka et al. |
| 6,441,682 B1 | 8/2002 | Vinn et al. |
| 6,445,257 B1 | 9/2002 | Cox et al. |
| 6,448,911 B1 | 9/2002 | Somayajula |
| 6,452,514 B1 | 9/2002 | Philipp |
| 6,457,355 B1 | 10/2002 | Philipp |
| 6,459,321 B1 | 10/2002 | Belch |
| 6,466,036 B1 | 10/2002 | Philipp |
| 6,473,069 B1 | 10/2002 | Gerpheide |
| 6,476,798 B1 | 11/2002 | Bertram et al. |
| 6,489,899 B1 | 12/2002 | Ely et al. |
| 6,490,203 B1 | 12/2002 | Tang |
| 6,498,720 B2 | 12/2002 | Glad |
| 6,499,359 B1 | 12/2002 | Washeleski et al. |
| 6,522,083 B1 | 2/2003 | Roach |
| 6,522,128 B1 | 2/2003 | Ely et al. |
| 6,522,187 B1 | 2/2003 | Sousa |
| 6,523,416 B2 | 2/2003 | Takagi et al. |
| 6,529,015 B2 | 3/2003 | Nonoyama et al. |
| 6,534,970 B1 | 3/2003 | Ely et al. |
| 6,535,200 B2 | 3/2003 | Philipp |
| 6,570,557 B1 | 5/2003 | Westerman et al. |
| 6,574,095 B2 | 6/2003 | Suzuki |
| 6,577,140 B1 | 6/2003 | Wenman |
| 6,583,632 B2 | 6/2003 | Von Basse et al. |
| 6,587,093 B1 | 7/2003 | Shaw et al. |
| 6,597,347 B1 | 7/2003 | Yasutake |
| 6,610,936 B2 | 8/2003 | Gillespie et al. |
| 6,614,313 B2 | 9/2003 | Crofts et al. |
| 6,624,640 B2 | 9/2003 | Lund et al. |
| 6,639,586 B2 | 10/2003 | Gerpheide |
| 6,642,857 B1 | 11/2003 | Schediwy et al. |
| 6,649,924 B1 | 11/2003 | Philipp et al. |
| 6,667,740 B2 | 12/2003 | Ely et al. |
| 6,673,308 B2 | 1/2004 | Hino et al. |
| 6,677,758 B2 | 1/2004 | Maki et al. |
| 6,677,932 B1 | 1/2004 | Westerman |
| 6,680,731 B2 | 1/2004 | Gerpheide et al. |
| 6,683,462 B2 | 1/2004 | Shimizu |
| 6,690,066 B1 | 2/2004 | Lin et al. |
| 6,704,005 B2 | 3/2004 | Kato et al. |
| 6,705,511 B1 | 3/2004 | Dames et al. |
| 6,714,817 B2 | 3/2004 | Daynes et al. |
| 6,720,777 B2 | 4/2004 | Wang |
| 6,730,863 B1 | 5/2004 | Gerpheide et al. |
| 6,731,121 B1 | 5/2004 | Hsu et al. |
| 6,744,258 B2 | 6/2004 | Ishio et al. |
| 6,750,852 B2 | 6/2004 | Gillespie et al. |
| 6,768,420 B2 | 7/2004 | McCarthy et al. |
| 6,774,644 B2 | 8/2004 | Eberlein |
| 6,781,577 B2 | 8/2004 | Shigetaka |
| 6,788,221 B1 | 9/2004 | Ely et al. |
| 6,788,521 B2 | 9/2004 | Nishi |
| 6,798,218 B2 | 9/2004 | Kasperkovitz |
| 6,806,693 B1 | 10/2004 | Bron |
| 6,809,275 B1 | 10/2004 | Cheng et al. |
| 6,810,442 B1 | 10/2004 | Lin et al. |
| 6,825,673 B1 | 11/2004 | Yamaoka |
| 6,825,890 B2 | 11/2004 | Matsufusa |
| 6,829,727 B1 | 12/2004 | Pawloski |
| 6,838,887 B2 | 1/2005 | Denen et al. |
| 6,839,052 B1 | 1/2005 | Kramer |
| 6,856,433 B2 | 2/2005 | Hatano et al. |
| 6,859,159 B2 | 2/2005 | Michalski |
| 6,861,961 B2 | 3/2005 | Sandbach et al. |
| 6,873,203 B1 | 3/2005 | Latham, II et al. |
| 6,879,215 B1 | 4/2005 | Roach |
| 6,882,338 B2 | 4/2005 | Flowers |
| 6,888,536 B2 | 5/2005 | Westerman et al. |
| 6,888,538 B2 | 5/2005 | Ely et al. |
| 6,891,531 B2 | 5/2005 | Lin |
| 6,893,724 B2 | 5/2005 | Lin et al. |
| 6,897,673 B2 | 5/2005 | Savage et al. |
| 6,903,402 B2 | 6/2005 | Miyazawa |
| 6,904,570 B2 | 6/2005 | Foote et al. |
| 6,914,547 B1 | 7/2005 | Swaroop et al. |
| 6,933,873 B1 | 8/2005 | Horsley et al. |
| 6,940,291 B1 | 9/2005 | Ozick |
| 6,946,853 B2 | 9/2005 | Gifford et al. |
| 6,949,811 B2 | 9/2005 | Miyazawa |
| 6,949,937 B2 | 9/2005 | Knoedgen |
| 6,958,594 B2 | 10/2005 | Redl et al. |
| 6,969,978 B2 | 11/2005 | Dening |
| 6,970,120 B1 | 11/2005 | Bjornsen |
| 6,970,126 B1 | 11/2005 | O'Dowd et al. |
| 6,975,123 B1 | 12/2005 | Malang et al. |
| 6,993,607 B2 | 1/2006 | Philipp |
| 6,999,009 B2 | 2/2006 | Monney |
| 7,002,557 B2 | 2/2006 | Iizuka et al. |
| 7,006,078 B2 | 2/2006 | Kim |
| 7,006,938 B2 | 2/2006 | Laraia et al. |
| 7,030,782 B2 | 4/2006 | Ely et al. |
| 7,030,860 B1 | 4/2006 | Hsu et al. |
| 7,031,886 B1 | 4/2006 | Hargreaves |
| 7,032,051 B2 | 4/2006 | Reay et al. |
| 7,036,096 B1 * | 4/2006 | Sarkar et al. .................. 716/108 |
| 7,046,230 B2 | 5/2006 | Zadesky et al. |
| 7,068,039 B2 | 6/2006 | Parker |
| 7,075,316 B2 | 7/2006 | Umeda et al. |
| 7,075,864 B2 | 7/2006 | Kakitsuka et al. |
| 7,078,916 B2 | 7/2006 | Denison |
| 7,098,675 B2 | 8/2006 | Inaba et al. |
| 7,109,978 B2 | 9/2006 | Gillespie et al. |
| 7,119,550 B2 | 10/2006 | Kitano et al. |
| 7,129,714 B2 | 10/2006 | Baxter |
| 7,129,935 B2 | 10/2006 | Mackey |
| 7,133,140 B2 | 11/2006 | Lukacs et al. |
| 7,133,793 B2 | 11/2006 | Ely et al. |
| 7,136,051 B2 | 11/2006 | Hein et al. |
| 7,141,968 B2 | 11/2006 | Hibbs et al. |
| 7,141,987 B2 | 11/2006 | Hibbs et al. |
| 7,148,704 B2 | 12/2006 | Philipp |
| 7,151,276 B2 | 12/2006 | Gerlach et al. |
| 7,151,528 B2 | 12/2006 | Taylor et al. |
| 7,158,056 B2 | 1/2007 | Wright et al. |
| 7,158,125 B2 | 1/2007 | Sinclair et al. |
| 7,202,655 B2 | 4/2007 | Itoh |
| 7,202,857 B2 | 4/2007 | Hinckley et al. |
| 7,205,777 B2 | 4/2007 | Schulz et al. |
| 7,212,189 B2 | 5/2007 | Shaw et al |
| 7,224,591 B2 | 5/2007 | Kaishita et al. |
| 7,225,090 B2 | 5/2007 | Coley |
| 7,233,508 B2 | 6/2007 | Itoh |
| 7,235,983 B2 | 6/2007 | O'Dowd et al. |
| 7,245,131 B2 | 7/2007 | Kurachi et al. |
| 7,253,643 B1 | 8/2007 | Seguine |
| 7,254,775 B2 | 8/2007 | Geaghan et al. |
| 7,256,588 B2 | 8/2007 | Howard et al. |
| 7,262,609 B2 | 8/2007 | Reynolds |
| 7,271,608 B1 | 9/2007 | Vermeire et al. |
| 7,288,946 B2 | 10/2007 | Hargreaves et al. |
| 7,288,977 B2 | 10/2007 | Stanley |
| 7,298,124 B2 | 11/2007 | Kan et al. |

(56) References Cited

U.S. PATENT DOCUMENTS

| | | |
|---|---|---|
| 7,301,350 B2 | 11/2007 | Hargreaves et al. |
| 7,307,485 B1 | 12/2007 | Snyder et al. |
| 7,312,616 B2 | 12/2007 | Snyder |
| 7,323,879 B2 | 1/2008 | Kuo et al. |
| 7,323,886 B2 | 1/2008 | Lee |
| 7,333,090 B2 | 2/2008 | Tanaka et al. |
| 7,339,580 B2 | 3/2008 | Westerman et al. |
| 7,359,816 B2 | 4/2008 | Kumar et al. |
| 7,375,535 B1 | 5/2008 | Kutz et al. |
| 7,381,031 B2 | 6/2008 | Kawaguchi et al. |
| 7,392,431 B2 | 6/2008 | Swoboda |
| 7,417,411 B2 | 8/2008 | Hoffman et al. |
| 7,417,441 B2 | 8/2008 | Reynolds |
| 7,423,437 B2 | 9/2008 | Hargreaves et al. |
| 7,439,962 B2 | 10/2008 | Reynolds et al. |
| 7,449,895 B2 | 11/2008 | Ely et al. |
| 7,450,113 B2 | 11/2008 | Gillespie et al. |
| 7,451,050 B2 | 11/2008 | Hargreaves |
| 7,453,270 B2 | 11/2008 | Hargreaves et al. |
| 7,453,279 B2 | 11/2008 | Corbin, Jr. et al. |
| 7,466,307 B2 | 12/2008 | Trent, Jr. et al. |
| 7,479,788 B2 | 1/2009 | Bolender et al. |
| 7,495,659 B2 | 2/2009 | Marriott et al. |
| 7,499,040 B2 | 3/2009 | Zadesky et al. |
| 7,504,833 B1 | 3/2009 | Seguine |
| 7,515,140 B2 | 4/2009 | Philipp |
| 7,521,941 B2 | 4/2009 | Ely et al. |
| RE40,867 E | 8/2009 | Binstead |
| 7,598,752 B2 | 10/2009 | Li |
| 7,598,822 B2 | 10/2009 | Rajagopal et al. |
| 7,663,607 B2 * | 2/2010 | Hotelling et al. ............ 345/173 |
| 7,667,468 B1 | 2/2010 | Anderson |
| 7,683,641 B2 | 3/2010 | Hargreaves et al. |
| 7,804,307 B1 | 9/2010 | Bokma et al. |
| 7,812,827 B2 | 10/2010 | Hotelling et al. |
| 7,812,829 B2 | 10/2010 | Gillespie et al. |
| 7,821,274 B2 | 10/2010 | Philipp et al. |
| 7,831,070 B1 | 11/2010 | Cheng et al. |
| 7,911,456 B2 | 3/2011 | Gillespie et al. |
| 7,932,897 B2 | 4/2011 | Elias et al. |
| 8,040,142 B1 | 10/2011 | Bokma et al. |
| 8,040,321 B2 | 10/2011 | Peng et al. |
| 8,054,299 B2 | 11/2011 | Krah |
| 8,067,948 B2 | 11/2011 | Sequine |
| 8,068,097 B2 | 11/2011 | Guanghai |
| 8,072,429 B2 | 12/2011 | Grivna |
| 8,082,566 B2 | 12/2011 | Stallings |
| 8,089,288 B1 | 1/2012 | Maharita |
| 8,089,289 B1 | 1/2012 | Kremin et al. |
| 8,093,914 B2 | 1/2012 | Maharyta |
| 8,094,128 B2 | 1/2012 | Vu et al. |
| 8,144,125 B2 | 3/2012 | Peng et al. |
| 8,144,126 B2 | 3/2012 | Wright |
| 8,169,238 B1 | 5/2012 | Maharyta et al. |
| 8,358,142 B2 | 1/2013 | Maharyta |
| 2001/0012667 A1 | 8/2001 | Ma et al. |
| 2002/0000978 A1 | 1/2002 | Gerpheide |
| 2002/0063688 A1 | 5/2002 | Shaw et al. |
| 2002/0067348 A1 | 6/2002 | Masters et al. |
| 2002/0109035 A1 | 8/2002 | Denen et al. |
| 2002/0136372 A1 | 9/2002 | Bozorgui-Nesbat |
| 2002/0140440 A1 | 10/2002 | Haase |
| 2002/0191029 A1 | 12/2002 | Gillespie et al. |
| 2003/0014239 A1 | 1/2003 | Ichbiah et al. |
| 2003/0025679 A1 | 2/2003 | Taylor et al. |
| 2003/0058053 A1 | 3/2003 | Jeon et al. |
| 2003/0062889 A1 | 4/2003 | Ely et al. |
| 2003/0063073 A1 | 4/2003 | Geaghan et al. |
| 2003/0063428 A1 | 4/2003 | Nishi |
| 2003/0076306 A1 | 4/2003 | Zadesky et al. |
| 2003/0080755 A1 | 5/2003 | Kobayashi |
| 2003/0091220 A1 | 5/2003 | Sato et al. |
| 2003/0098858 A1 | 5/2003 | Perski et al. |
| 2003/0112021 A1 | 6/2003 | Palata et al. |
| 2003/0156098 A1 | 8/2003 | Shaw et al. |
| 2003/0160808 A1 | 8/2003 | Foote et al. |
| 2003/0178675 A1 | 9/2003 | Nishizaka et al. |
| 2003/0183864 A1 | 10/2003 | Miyazawa |
| 2003/0183884 A1 | 10/2003 | Miyazawa |
| 2003/0184315 A1 | 10/2003 | Eberlein |
| 2003/0189419 A1 | 10/2003 | Maki et al. |
| 2003/0230438 A1 | 12/2003 | Keefer et al. |
| 2003/0232507 A1 | 12/2003 | Chen |
| 2004/0041798 A1 | 3/2004 | Kim |
| 2004/0056845 A1 | 3/2004 | Harkcom et al. |
| 2004/0068409 A1 | 4/2004 | Tanaka et al. |
| 2004/0082198 A1 | 4/2004 | Nakamura et al. |
| 2004/0169594 A1 | 9/2004 | Ely et al. |
| 2004/0178989 A1 | 9/2004 | Shahoian et al. |
| 2004/0178997 A1 | 9/2004 | Gillespie et al. |
| 2004/0183560 A1 | 9/2004 | Savage et al. |
| 2004/0217945 A1 | 11/2004 | Miyamoto et al. |
| 2004/0239616 A1 | 12/2004 | Collins |
| 2004/0239650 A1 | 12/2004 | Mackey |
| 2004/0252109 A1 | 12/2004 | Trent et al. |
| 2004/0263864 A1 | 12/2004 | Lukacs et al. |
| 2005/0021269 A1 | 1/2005 | Ely et al. |
| 2005/0024341 A1 | 2/2005 | Gillespie et al. |
| 2005/0031175 A1 | 2/2005 | Hara et al. |
| 2005/0062732 A1 | 3/2005 | Sinclair et al. |
| 2005/0073302 A1 | 4/2005 | Hibbs et al. |
| 2005/0073322 A1 | 4/2005 | Hibbs et al. |
| 2005/0083110 A1 | 4/2005 | Latham, II et al. |
| 2005/0099188 A1 | 5/2005 | Baxter |
| 2005/0159126 A1 | 7/2005 | Wang |
| 2005/0169768 A1 | 8/2005 | Kawaguchi et al. |
| 2005/0179668 A1 | 8/2005 | Edwards |
| 2005/0270273 A1 | 12/2005 | Marten |
| 2005/0275382 A1 | 12/2005 | Stessman et al. |
| 2005/0280639 A1 | 12/2005 | Taylor et al. |
| 2005/0283330 A1 | 12/2005 | Laraia et al. |
| 2006/0022660 A1 | 2/2006 | Itoh |
| 2006/0026535 A1 | 2/2006 | Hotelling et al. |
| 2006/0032680 A1 | 2/2006 | Elias et al. |
| 2006/0033508 A1 | 2/2006 | Lee |
| 2006/0033724 A1 | 2/2006 | Chaudhri et al. |
| 2006/0038793 A1 | 2/2006 | Philipp |
| 2006/0049834 A1 | 3/2006 | Umeda |
| 2006/0053387 A1 | 3/2006 | Ording |
| 2006/0066582 A1 | 3/2006 | Lyon et al. |
| 2006/0066585 A1 | 3/2006 | Lin |
| 2006/0097991 A1 | 5/2006 | Hotelling et al. |
| 2006/0097992 A1 | 5/2006 | Gitzinger et al. |
| 2006/0108349 A1 | 5/2006 | Finley et al. |
| 2006/0113974 A1 | 6/2006 | Kan et al. |
| 2006/0114247 A1 | 6/2006 | Brown |
| 2006/0139469 A1 | 6/2006 | Yokota et al. |
| 2006/0152739 A1 | 7/2006 | Silvestre |
| 2006/0164142 A1 | 7/2006 | Stanley |
| 2006/0172767 A1 | 8/2006 | Cathey et al. |
| 2006/0176718 A1 | 8/2006 | Itoh |
| 2006/0187214 A1 | 8/2006 | Gillespie et al. |
| 2006/0193156 A1 | 8/2006 | Kaishita et al. |
| 2006/0197750 A1 | 9/2006 | Kerr et al. |
| 2006/0197752 A1 | 9/2006 | Hurst et al. |
| 2006/0221061 A1 | 10/2006 | Fry |
| 2006/0227117 A1 | 10/2006 | Proctor |
| 2006/0232559 A1 | 10/2006 | Chien et al. |
| 2006/0256090 A1 * | 11/2006 | Huppi ........................ 345/173 |
| 2006/0258390 A1 | 11/2006 | Cui et al. |
| 2006/0262101 A1 | 11/2006 | Layton et al. |
| 2006/0267953 A1 | 11/2006 | Peterson et al. |
| 2006/0273804 A1 | 12/2006 | Delorme |
| 2006/0290678 A1 | 12/2006 | Lii |
| 2007/0046299 A1 | 3/2007 | Hargreaves et al. |
| 2007/0069274 A1 | 3/2007 | Elsass et al. |
| 2007/0074913 A1 | 4/2007 | Geaghan et al. |
| 2007/0076897 A1 | 4/2007 | Philipp |
| 2007/0100566 A1 | 5/2007 | Coley |
| 2007/0132737 A1 | 6/2007 | Mulligan et al. |
| 2007/0152977 A1 | 7/2007 | Ng et al. |
| 2007/0152983 A1 | 7/2007 | Mckillop et al. |
| 2007/0164756 A1 | 7/2007 | Lee |
| 2007/0173220 A1 | 7/2007 | Kim et al. |

(56) References Cited

U.S. PATENT DOCUMENTS

| | | | |
|---|---|---|---|
| 2007/0176609 A1 | 8/2007 | Ely et al. |
| 2007/0176903 A1 | 8/2007 | Dahlin et al. |
| 2007/0229469 A1 | 10/2007 | Seguine |
| 2007/0236478 A1 | 10/2007 | Geaghan et al. |
| 2007/0257894 A1 | 11/2007 | Philipp |
| 2007/0263191 A1 | 11/2007 | Shibazaki |
| 2007/0268243 A1 | 11/2007 | Choo et al. |
| 2007/0268265 A1 | 11/2007 | Xiaoping |
| 2007/0268273 A1 | 11/2007 | Westerman et al. |
| 2007/0268274 A1 | 11/2007 | Westerman et al. |
| 2007/0268275 A1 | 11/2007 | Westerman et al. |
| 2007/0273659 A1 | 11/2007 | Xiaoping et al. |
| 2007/0291013 A1 | 12/2007 | Won |
| 2007/0296709 A1 | 12/2007 | Guanghai |
| 2008/0007529 A1 | 1/2008 | Paun et al. |
| 2008/0007534 A1 | 1/2008 | Peng et al. |
| 2008/0024455 A1 | 1/2008 | Lee et al. |
| 2008/0036473 A1 | 2/2008 | Jansson |
| 2008/0041639 A1 | 2/2008 | Westerman et al. |
| 2008/0041640 A1 | 2/2008 | Gillespie et al. |
| 2008/0042986 A1 | 2/2008 | Westerman et al. |
| 2008/0042987 A1 | 2/2008 | Westerman et al. |
| 2008/0042988 A1 | 2/2008 | Westerman et al. |
| 2008/0042989 A1 | 2/2008 | Westerman et al. |
| 2008/0042994 A1 | 2/2008 | Gillespie et al. |
| 2008/0047764 A1 | 2/2008 | Lee et al. |
| 2008/0048997 A1 | 2/2008 | Gillespie et al. |
| 2008/0062139 A1 | 3/2008 | Hotelling et al. |
| 2008/0062140 A1 | 3/2008 | Hotelling et al. |
| 2008/0062148 A1* | 3/2008 | Hotelling et al. | 345/174 |
| 2008/0068100 A1 | 3/2008 | Goodnow et al. |
| 2008/0072192 A1* | 3/2008 | Lenahan | 716/5 |
| 2008/0088595 A1 | 4/2008 | Liu et al. |
| 2008/0111714 A1 | 5/2008 | Kremin |
| 2008/0116904 A1 | 5/2008 | Reynolds et al. |
| 2008/0128182 A1 | 6/2008 | Westerman et al. |
| 2008/0150906 A1 | 6/2008 | Grivna |
| 2008/0158177 A1* | 7/2008 | Wilson et al. | 345/173 |
| 2008/0158178 A1 | 7/2008 | Hotelling et al. |
| 2008/0162997 A1 | 7/2008 | Vu et al. |
| 2008/0165134 A1 | 7/2008 | Krah |
| 2008/0179112 A1 | 7/2008 | Qin et al. |
| 2008/0180399 A1* | 7/2008 | Cheng | 345/173 |
| 2008/0196945 A1 | 8/2008 | Konstas |
| 2008/0250864 A1 | 10/2008 | Shipton |
| 2008/0266263 A1 | 10/2008 | Motaparti et al. |
| 2008/0278178 A1 | 11/2008 | Philipp |
| 2008/0309623 A1* | 12/2008 | Hotelling et al. | 345/173 |
| 2008/0309634 A1* | 12/2008 | Hotelling et al. | 345/173 |
| 2009/0002206 A1 | 1/2009 | Kremin |
| 2009/0096758 A1 | 4/2009 | Hotelling et al. |
| 2009/0153152 A1 | 6/2009 | Maharyta et al. |
| 2009/0322351 A1 | 12/2009 | Mcleod |
| 2010/0001973 A1* | 1/2010 | Hotelling et al. | 345/174 |
| 2010/0328262 A1* | 12/2010 | Huang et al. | 345/174 |
| 2011/0025629 A1* | 2/2011 | Grivna et al. | 345/173 |
| 2011/0156724 A1 | 6/2011 | Bokma et al. |
| 2011/0234523 A1* | 9/2011 | Chang et al. | 345/173 |
| 2012/0043140 A1 | 2/2012 | Peterson et al. |
| 2012/0043973 A1 | 2/2012 | Kremin |
| 2012/0043976 A1 | 2/2012 | Bokma et al. |
| 2013/0049771 A1* | 2/2013 | Peng et al. | 324/658 |

FOREIGN PATENT DOCUMENTS

| | | |
|---|---|---|
| JP | 04012528 | 1/1992 |
| JP | 05283519 B1 | 10/1993 |
| JP | 6104334 A | 4/1994 |
| JP | 6163528 A | 6/1994 |
| WO | 0002188 A | 1/2000 |

OTHER PUBLICATIONS

USPTO Notice of Allowance for U.S. Appl. No. 12/239,692 dated Aug. 15, 2012; 8 pages.

USPTO Notice of Allowance for U.S. Appl. No. 12/239,692 dated Sep. 18, 2012; 8 pages.

USPTO Notice of Allowance for U.S. Appl. No. 12/606,147 dated Aug. 13, 2012; 7 pages.

U.S. Appl. No. 60/947,865: "Capacitive Field Sensor with Sigma-Delt Modulator," Viktor Kremin, filed Jul. 3, 2007; 33 pages.

U.S. Appl. No. 61/030,526: "Capacitive Sensing Universal System and Method," Andriy Ryshtun, filed Feb. 21, 2008; 22 pages.

U.S. Appl. No. 61/108,450: "Alternative Realizations of the CSX (TxRx-I) Sensing Scheme for ITO Panels," Andriy Maharyta, filed Oct. 24, 2008; 7 pages.

USPTO Non-Final Rejection for U.S. Appl. No. 12/380,141 dated Sep. 5, 2012; 6 pages.

USPTO Notice of Allowance for U.S. Appl. No. 12/380,141 dated Jun. 14, 2012; 8 pages.

USPTO Notice of Allowance for U.S. Appl. No. 12/380,141 dated Jul. 31, 2012; 5 pages.

U.S. Appl. No. 12/040,387: "Touch Sensing," Peterson et al., filed Feb. 29, 2008; 28 pages.

Chapweske, Adam; "The PS/2 Mouse Interface," PS/2 Mouse Interfacing, 2001, retrieved on May 18, 2006; 11 pages.

Cypress Semiconductor Corporation, "CY8C21x34 Data Sheet," CSR User Module, CSR V.1.0; Oct. 6, 2005; 36 pages.

USPTO Notice of Allowance for U.S. Appl. No. 12/239,692 dated Jun. 25, 2012; 8 pages.

USPTO Requirement Restriction for U.S. Appl. No. 11/824,249 dated Feb. 17, 2011; 5 pages.

USPTO Restriction Requirement, U.S. Appl. No. 11/601,465, dated Nov. 1, 2007, 7 pages.

USPTO Restriction Requirement, U.S. Appl. No. 13/047,620, dated Feb. 27, 2012, 7 pages.

Van Ess, David; "Simulating a 555 Timer with PSoC," Cypress Semiconductor Corporation, Application Note AN2286, May 19, 2005; 10 pages.

Vladislav Golub, Ph.D., "Sigma-Delta ADCs", pub. date: Jun. 17, 2003, 10 pages.

Wikipedia, The Free Encyclopedia, "IBM PC Keyboard," <http://en.wikipedia.org/wiki/PC_keyboard> accessed May 19, 2006; 3 pages.

Written Opinion of the International Searching Authority for International Application No. PCT/US08/60696 dated Sep. 22, 2008; 4 pages.

Written Opinion of the International Searching Authority for International Application No. PCT/US2008/013622 mailed Feb. 9, 2009; 5 pages.

USPTO Non-Final Rejection for U.S. Appl. No. 11/395,417 dated Nov. 1, 2007; 8 pages.

USPTO Non-Final Rejection for U.S. Appl. No. 11/437,517 dated Aug. 3, 2010; 10 pages.

USPTO Non-Final Rejection for U.S. Appl. No. 11/437,517 dated Aug. 5, 2009; 9 pages.

USPTO Non-Final Rejection for U.S. Appl. No. 11/442,212 dated Feb. 25, 2011; 13 pages.

USPTO Non-Final Rejection for U.S. Appl. No. 11/442,212 dated Mar. 31, 2009;12 pages.

USPTO Non-Final Rejection for U.S. Appl. No. 11/442,212 dated Jul. 6, 2010; 13 pages.

USPTO Non-Final Rejection for U.S. Appl. No. 11/477,179 dated Jun. 9, 2009; 13 pages.

USPTO Non-Final Rejection for U.S. Appl. No. 11/477,179 dated Jul. 20, 2010; 10 pages.

USPTO Non-Final Rejection for U.S. Appl. No. 11/477,179 dated Nov. 18, 2009; 10 pages.

USPTO Non-Final Rejection for U.S. Appl. No. 11/484,085 dated Sep. 17, 2009; 8 pages.

USPTO Non-Final Rejection for U.S. Appl. No. 11/493,350 dated Jun. 16, 2010; 8 pages.

USPTO Non-Final Rejection for U.S. Appl. No. 11/493,350 dated Nov. 9, 2010; 9 pages.

USPTO Non-Final Rejection for U.S. Appl. No. 11/502,267 dated Aug. 11, 2008; 10 pages.

USPTO Non-Final Rejection for U.S. Appl. No. 11/600,255 dated Mar. 29, 2010; 10 pages.

(56) References Cited

OTHER PUBLICATIONS

USPTO Non-Final Rejection for U.S. Appl. No. 11/600,896 dated May 14, 2010; 15 pages.
USPTO Non-Final Rejection for U.S. Appl. No. 11/600,896 dated Dec. 16, 2009; 13 pages.
USPTO Non-Final Rejection for U.S. Appl. No. 11/700,314 dated Mar. 26, 2010; 7 pages.
USPTO Non-Final Rejection for U.S. Appl. No. 11/709,897 dated Feb. 16, 2010; 21 pages.
USPTO Non-Final Rejection for U.S. Appl. No. 11/729,818 dated Dec. 17, 2008; 12 pages.
USPTO Non-Final Rejection for U.S. Appl. No. 11/823,982 dated Mar. 19, 2009; 14 pages.
USPTO Non-Final Rejection for U.S. Appl. No. 11/824,249 dated May 25, 2011; 9 pages.
USPTO Non-Final Rejection for U.S. App. No. 11/880,963 dated Jun. 12, 2009; 10 pages.
USPTO Non-Final Rejection for U.S. Appl. No. 11/967,243 dated Sep. 17, 2009; 9 pages.
USPTO Non-Final Rejection for U.S. Appl. No. 11/983,291 dated Mar. 9, 2009; 9 pages.
USPTO Non-Final Rejection for U.S. Appl. No. 12/040,387 dated Jun. 30, 2011; 12 pages.
USPTO Non-Final Rejection for U.S. Appl. No. 12/166,228 dated Dec. 30, 2009; 11 pages.
USPTO Non-Final Rejection for U.S. Appl. No. 12/239,692 dated Nov. 29, 2010; 9 pages.
USPTO Non-Final Rejection for U.S. Appl. No. 12/367,279 dated Oct. 29, 2009; 8 pages.
USPTO Non-Final Rejection for U.S. Appl. No. 12/380,141 dated Sep. 19, 2011; 6 pages.
USPTO Non-Final Rejection for U.S. Appl. No. 12/395,969 dated Dec. 16, 2011; 17 pages.
USPTO Non-Final Rejection for U.S. Appl. No. 12/606,147 dated Aug. 23, 2011; 6 pages.
USPTO Non-Final Rejection for U.S. Appl. No. 12/861,812 dated Apr. 15, 2011; 26 pages.
USPTO Non-Final Rejection, U.S. Appl. No. 11/512,042, dated Jul. 13, 2010, 14 pages.
USPTO Non-Final Rejection, U.S. Appl. No. 11/601,465, dated Oct. 2, 2008, 16 pages.
USPTO Non-Final Rejection, U.S. Appl. No. 11/601,465, dated Dec. 28, 2007, 16 pages.
USPTO Non-Final Rejection, U.S. Appl. No. 11/824,249, dated Mar. 30, 2011, 10 pages.
USPTO Non-Final Rejection, U.S. Appl. No. 12/332,980, dated Dec. 22, 2010, 20 pages.
USPTO Notice of Allowance for U.S. Appl. No. 09/975,105 dated Dec. 4, 2006; 4 pages.
USPTO Notice of Allowance for U.S. Appl. No. 11/600,255 dated May 30, 2012.
USPTO Notice of Allowance for U.S. Appl. No. 09/986,338 dated Feb. 16, 2010; 4 pages.
USPTO Notice of Allowance for U.S. Appl. No. 10/888,666 dated Aug. 2, 2006; 11 pages.
USPTO Notice of Allowance for U.S. Appl. No. 11/230,719 dated Jan. 16, 2008; 4 pages.
USPTO Notice of Allowance for U.S. Appl. No. 11/273,708 dated Aug. 9, 2007; 4 pages.
USPTO Notice of Allowance for U.S. Appl. No. 11/337,272 dated Aug. 15, 2007; 9 pages.
USPTO Notice of Allowance for U.S. Appl. No. 11/395,417 dated Nov. 6, 2008; 7 pages.
USPTO Notice of Allowance for U.S. Appl. No. 11/484,085 dated Jun. 10, 2010; 4 pages.
USPTO Notice of Allowance for U.S. Appl. No. 11/489,944 dated Apr. 9, 2007; 7 pages.
USPTO Notice of Allowance for U.S. Appl. No. 11/489,944 dated May 24, 2007; 2 pages.
USPTO Notice of Allowance for U.S. Appl. No. 11/600,255 dated Apr. 20, 2011; 7 pages.
U.S. Appl. No. 12/861,812 "Capacitance Measurement Systems and Methods", filed Aug. 23, 2010, 24 pages.
U.S. Appl. No. 13/047,620 "Touch Detection Techniques for Capacitive Touch Sense Systems", filed Mar. 14, 2011, 38 pages.
U.S. Appl. No. 13/191,806 "Capacitance Measurement Systems and Methods", filed Jul. 27, 2011, 38 pages.
U.S. Appl. No. 13/342,942 "Capacitive Field Sensor With Sigma-Delta Modulator", filed Jan. 3, 2012, 41 pages.
U.S. Appl. No. 13/345,504 "Compensation Circuit for a TX-RX Capacitive Sensor", filed Jan. 6, 2012, 55 pages.
U.S. Appl. No. 61/016,123 "Capacitive Field Sensor With Sigma-Delta Modulator" filed Dec. 21, 2007, 34 pages.
U.S. Appl. No. 13/049,798: "Capacitance to Code Converter With Sigma-Delta Modulator," Kremin, filed Mar. 16, 2011; 77 pages.
U.S. Appl. No. 11/493,350: "Technique for Increasing the Sensitivity of Capacitive Sensor Arrays," Lee et al., filed Jul. 25, 2006; 48 pages.
U.S. Appl. No. 11/600,255 "Capacitance to Code Converter With Sigma-Delta Modulator," Kremin, filed Nov. 14, 2006; 102 pages.
U.S. Appl. No. 11/709,897: "Preventing Unintentional Activation of a Sensor Element of a Sensing Device," Jason Konstas; filed Feb. 21, 2007; 97 pages.
U.S. Appl. No. No. 12/197,466: "Radical Oxidation Process for Fabricating a Nonvolatile Charge Trap Memory Device," Ramkumar et al., filed Aug. 25, 2008; 68 pages.
U.S. Appl. No. 12/239,692 "System and Method to Measure Capacitance of Capacitive Sensor Array" Nathan Moyal et al., filed Sep. 26, 2008; 36 pages.
U.S. Appl. No. 12/380,141: "Capacitive field sensor with sigma-delta modulator," Rystun et al., filed Feb. 23, 2009; 48 pages.
U.S. Appl. No. 12/395,969: "Multi-Touch Sensing Method," Dana Olson, filed Mar. 2, 2009; 22 pages.
U.S. Appl. No. 12/618,661 (CD08224): "Automatic Tuning of a Capacitive Sensing Device," Dana Olson, filed Nov. 13, 2009; 30 pages.
U.S. Appl. No. 60/220,921: "Method for Automatically Tuning a Capacitive Sensing Device," Dana Olson, filed Jun. 26, 2009; 13 pages.
U.S. Appl. No. 61/023,988: "Touch Sensing" Jon Peterson, et al., filed Jan. 28, 2008; 26 pages.
U.S. Appl. No. 61/024,158 "Multi-Touch Sensing Method With Differential Input" Dana Olson et al., filed on Jan. 28, 2008; 19 pages.
U.S. Appl. No. 61/067,539 "Methods and Circuits for Measuring Mutual and Self Capacitance" Andriy Maharyta et al., filed Feb. 27, 2008; 40 pages.
U.S. Appl. No. 61/067,743 "Multi-Touch Sensing Method with Differential Input" Dana Olson et al., filed Feb. 29, 2008; 19 pages.
Cypress Semiconductor Corporation, "Cypress Introduces PSoC(TM)-Based Capacitive Touch Sensor Solution," Cypress Press Release; May 31, 2005; <http://www.cypress.com/portal/server>; retrieved on Feb. 5, 2007; 4 pages.
Cypress Semiconductor Corporation, "PSoC Mixed-Signal Controllers," Production Description; <http://www.cypress.com/portal/server>; retrieved on Sep. 27, 2005; 2 pages.
Cypress Semiconductor Corporation, "Release Notes sm017," Jan. 24, 2007; 3 pages.
International Search Report for International Application No. PCT/US05/23468 dated Aug. 25, 2006; 2 pages.
International Search Report of the International Searching Authority for International Application No. PCT/US2008/013622 mailed Feb. 9, 2009; 2pages.
International Search Report of the International Searching Authority, dated Feb. 9, 2009 for International Application No. PCTUS2008/013622; 2 pages.
International Written Opinion of the International Searching Authority, dated Feb. 9, 2009 for International Application No. PCT/US2008/013622; 5 pages.
Kremin, V. "Noise resistant capacitive sensor," U.S. Appl. No. 11/824,249 filed Jun. 29, 2007.
Mack, Chris, "Semiconductor Lithography—The Basic Process", Gentleman Scientist, downloaded Apr. 20, 2006, 12 pages, http://lithoguru.com/scientist/lithobasics.html.

(56) References Cited

OTHER PUBLICATIONS

Mark Lee, "CapSense Best Practice", Cypress Application Note AN2394, Rev. **, Oct. 19, 2006, pp. 1-10.

Ryan Seguine et al, "Layout Guidelines for PSoC CapSense", Cypress Application Note AN2292, Revision B, Oct. 31, 2005, pp. 1-15.

Sedra, Adel S. et al., "Microelectronic Circuits," 3rd Edition, Oxford University Press, pp. xiii-xx and 861-883, 1991; 20 pages.

The Written Opinion of the International Searching Authority for International Application No. PCT/US05/23468 dated Aug. 25, 2006; 7 pages.

USPTO Notice of Allowance for U.S. Appl. No. 11/600,255 dated Jun. 16, 2011; 7 pages.

USPTO Notice of Allowance for U.S. Appl. No. 11/600,255 dated Jul. 27, 2010; 6 pages.

USPTO Notice of Allowance for U.S. Appl. No. 11/600,255 dated Dec. 9, 2010; 6 pages.

USPTO Notice of Allowance for U.S. Appl. No. 11/700,314 dated Sep. 16, 2010; 8 pages.

USPTO Notice of Allowance for U.S. Appl. No. 11/709,866 dated Feb. 16, 2010; 7 pages.

USPTO Notice of Allowance for U.S. Appl. No. 11/729,818 dated Feb. 24, 2010; 6 pages.

USPTO Notice of Allowance for U.S. Appl. No. 11/729,818 dated Nov. 13, 2009; 7 pages.

USPTO Notice of Allowance for U.S. Appl. No. 11/823,982 dated Feb. 1, 2010; 8 pages.

USPTO Notice of Allowance for U.S. Appl. No. 11/823,982 dated Oct. 6, 2009; 12 pages.

USPTO Notice of Allowance for U.S. Appl. No. 11/880,963 dated Oct. 2, 2009; 4 pages.

USPTO Notice of Allowance for U.S. Appl. No. 11/983,291 dated Mar. 9, 2010; 7 pages.

USPTO Notice of Allowance for U.S. Appl. No. 11/983,291 dated Jun. 21, 2010; 7 pages.

USPTO Notice of Allowance for U.S. Appl. No. 11/983,291 dated Sep. 29, 2010; 7 pages.

USPTO Notice of Allowance for U.S. Appl. No. 11/983,291 dated Oct. 22, 2009; 7 pages.

USPTO Notice of Allowance for U.S. Appl. No. 12/040,387 dated Mar. 29, 2012; 8 pages.

USPTO Notice of Allowance for U.S. Appl. No. 12/166,228 dated Mar. 22, 2011; 8 pages.

USPTO Notice of Allowance for U.S. Appl. No. 12/167,100 dated Jan. 12, 2011; 8 pages.

USPTO Notice of Allowance for U.S. Appl. No. 12/167,100 dated Apr. 29, 2011; 8 pages.

USPTO Notice of Allowance for U.S. Appl. No. 12/167,100 dated Jun. 28, 2011; 8 pages.

USPTO Notice of Allowance for U.S. Appl. No. 12/167,100 dated Sep. 1, 2011; 8 pages.

USPTO Notice of Allowance for U.S. Appl. No. 12/167,100 dated Sep. 30, 2010; 7 pages.

USPTO Notice of Allowance for U.S. Appl. No. 12/239,692 dated Jan. 5, 2012; 8 pages.

USPTO Notice of Allowance for U.S. Appl. No. 12/239,692 dated May 16, 2012; 8 pages.

USPTO Notice of Allowance for U.S. Appl. No. 12/239,692 dated Oct. 13, 2011; 8 pages.

USPTO Notice of Allowance for U.S. Appl. No. 12/332,980 dated Oct. 4, 2011; 5 pages.

USPTO Notice of Allowance for U.S. Appl. No. 12/367,279 dated Aug. 23, 2010; 7 pages.

USPTO Notice of Allowance for U.S. Appl. No. 12/380,141 dated Jan. 26, 2012; 7 pages.

USPTO Notice of Allowance for U.S. Appl. No. 12/380,141 dated Apr. 10, 2012; 7 pages.

USPTO Notice of Allowance for U.S. Appl. No. 12/380,141 dated May 15, 2012; 7 pages.

USPTO Notice of Allowance, U.S. Appl. No. 11/600,255, dated Apr. 12, 2012, 15 pages.

USPTO Notice of Allowance, U.S. Appl. No. 11/601,465, dated Jan. 11, 2010, 18 pages.

USPTO Notice of Allowance, U.S. Appl. No. 11/601,465, dated Mar. 11, 2011, 17 pages.

USPTO Notice of Allowance, U.S. Appl. No. 11/601,465, dated Apr. 22, 2010, 41 pages.

USPTO Notice of Allowance, U.S. Appl. No. 11/601,465, dated May 8, 2009, 14 pages.

USPTO Notice of Allowance, U.S. Appl. No. 11/601,465, dated Jun 28, 2011, 21 pages.

USPTO Notice of Allowance, U.S. Appl. No. 11/601,465, dated Aug. 10, 2010, 17 pages.

USPTO Notice of Allowance, U.S. Appl. No. 11/601,465, dated Sep. 10, 2009, 21 pages.

USPTO Notice of Allowance, U.S. Appl. No. 11/601,465, dated Oct. 7, 2011, 19 pages.

USPTO Notice of Allowance, U.S. Appl. No. 11/601,465, dated Nov. 26, 2010, 16 pages.

USPTO Notice of Allowance, U.S. Appl. No. 11/729,818, dated Jan. 26, 2011, 12 pages.

USPTO Notice of Allowance, U.S. Appl. No. 11/729,818, dated May 9, 2011, 8 pages.

USPTO Notice of Allowance, U.S. Appl. No. 11/729,818, dated Jun. 9, 2011, 13 pages.

USPTO Notice of Allowance, U.S. Appl. No. 11/729,818, dated Oct. 5, 2010, 33 pages.

USPTO Notice of Allowance, U.S. Appl. No. 11/729,818, dated Jun. 25, 2010, 7 pages.

USPTO Notice of Allowance, U.S. Appl. No. 11/823,982, dated May 14, 2010, 8 pages.

USPTO Notice of Allowance, U.S. Appl. No. 131047,620, dated Apr. 11, 2012, 19 pages.

USPTO Requirement for Restriction for U.S. Appl. No. 12/167,100 dated Aug. 20, 2010; 6 pages.

USPTO Requirement for Restriction for U.S. Appl. No. 12/239,692 dated Sep. 27, 2010; 7 pages.

USPTO Requirement for Restriction for U.S. Appl. No. 12/380,141 dated Jul. 8, 2011; 6 pages.

USPTO Requirement for Restriction/Election for U.S. Appl. No. 11/337,272 dated Sep. 11, 2006; 5 pages.

USPTO Advisory Action for U.S. Appl. No. 11/230,719 dated Nov. 30, 2007; 3 pages.

USPTO Advisory Action for U.S. Appl. No. 11/337,272 dated Apr. 3, 2007; 3 pages.

USPTO Advisory Action for U.S. Appl. No. 11/395,41 dated Jul. 6, 2007; 3 pages.

USPTO Advisory Action for U.S. Appl. n No. 11/437,517 dated Apr. 7, 2010; 3 pages.

USPTO Advisory Action for U.S. Appl. No. 11/442,212 dated Jan. 5, 2011; 3 pages.

USPTO Advisory Action for U.S. Appl. No. 11/442,212 dated Dec. 17, 2009; 3 pages.

USPTO Advisory Action for U.S. Appl. No. 11/477,179 dated Jun. 7, 2010; 3 pages.

USPTO Advisory Action for U.S. Appl. No. 11/512,042 dated Feb. 23, 2011; 3 pages.

USPTO Advisory Action for U.S. Appl. No. 12/367,279 dated Jun. 25, 2010; 3 pages.

USPTO Advisory Action, U.S. Appl. No. 12/332,980, dated Aug. 9, 2011, 4 pages.

USPTO Final Rejection for U.S. Appl. No. 09/975,105 dated Jul. 13, 2006; 7 pages.

USPTO Final Rejection for U.S. Appl. No. 11/230,719 dated Sep. 7, 2007; 9 pages.

USPTO Final Rejection for U.S. Appl. No. 11/273,708 dated Jul. 5, 2007; 8 pages.

USPTO Final Rejection for U.S. Appl. No. 11/337,272 dated Feb. 2, 2007; 11 pages.

USPTO Final Rejection for U.S. Appl. No. 11/395,417 dated Apr. 24, 2007; 9 pages.

(56) References Cited

OTHER PUBLICATIONS

USPTO Final Rejection for U.S. Appl. No. 11/437,517 dated Jan. 26, 2010; 11 pages.
USPTO Final Rejection for U.S. Appl. No. 11/442,212 dated Jun. 7, 2011; 14 pages.
USPTO Final Rejection for U.S. Appl. No. 11/442,212 dated Oct. 2, 2009; 12 pages.
USPTO Final Rejection for U.S. Appl. No. 11/442,212 dated Oct. 13, 2010; 13 pages.
USPTO Final Rejection for U.S. Appl. No. 11/477,179 dated Apr. 1, 2010; 10 pages.
USPTO Final Rejection for U.S. Appl. No. 11/477,179 dated Nov. 24, 2010; 10 pages.
USPTO Final Rejection for U.S. Appl. No. 11/484,085 dated Mar. 16, 2010; 7 pages.
USPTO Final Rejection for U.S. Appl. No. 11/502,267 dated Feb. 3, 2009; 10 pages.
USPTO Final Rejection for U.S. Appl. No. 11/512,042 dated Dec. 21, 2010; 7 pages.
USPTO Final Rejection for U.S. Appl. No. 11/600,896 dated Sep. 30; 19 pages.
USPTO Final Rejection for U.S. Appl. No. 11/601,465 dated May 28, 2010; 12 pages.
USPTO Final Rejection for U.S. Appl. No. 11/709,897 dated Jul. 29, 2010; 24 pages.
USPTO Final Rejection for U.S. Appl. No. 11/983,291 dated Aug. 12, 2009; 10 pages.
USPTO Final Rejection for U.S. Appl. No. 12/040,387 dated Nov. 21, 2011; 13 pages.
USPTO Final Rejection for U.S. Appl. No. 12/166,228 dated Jan. 4, 2011; 9 pages.
USPTO Final Rejection for U.S. Appl. No. 12/166,228 dated May 28, 2010; 12 pages.
USPTO Final Rejection for U.S. Appl. No. 12/239,692 dated May 9, 2010; 10 pages.
USPTO Final Rejection for U.S. Appl. No. 12/367,279 dated Apr. 1, 2010; 6 pages.
USPTO Final Rejection, U.S. Appl. No. 11/601,465, dated Mar. 6, 2009, 13 pages.
USPTO Final Rejection, U.S. Appl. No. 11/601,465, dated Jul. 9, 2008, 16 pages.
USPTO Final Rejection, U.S. Appl. No. 11/729,818, dated Jul. 2, 2009, 14 pages.
USPTO Final Rejection, U.S. Appl. No. 11/824,249, dated Dec. 22, 2011, 12 pages.
USPTO Final Rejection, U.S. Appl. No. 12/332,980, dated May 31, 2011, 12 pages.
USPTO Final Rejection, U.S. Appl. No. 12/861,812, dated Oct. 18, 2011, 16 pages.
USPTO Non-Final Rejection for U.S. Appl. No. 09/975,105 dated Jan. 19, 2006; 5 pages.
USPTO Non-Final Rejection for U.S. Appl. No. 09/975,105 dated Apr. 19, 2005; 9 pages.
USPTO Non-Final Rejection for U.S. Appl. No. 11/230,719 dated Jan. 16, 2007; 8 pages.
USPTO Non-Final Rejection for U.S. Appl. No. 11/230,719 dated May 11, 2006; 5 pages.
USPTO Non-Final Rejection for U.S. Appl. No. 11/230,719 dated May 25, 2007; 6 pages.
USPTO Non-Final Rejection for U.S. Appl. No. 11/230,719 dated Aug. 28, 2008; 7 pages.
USPTO Non-Final Rejection for U.S. Appl. No. 11/273,708 dated Mar. 19, 2007; 16 pages.
USPTO Non-Final Rejection for U.S. Appl. No. 11/337,272 dated May 17, 2007; 11 pages.
Non-Final Rejection for U.S. Appl. No. 11/337,272 dated Oct. 24, 2006; 9 pages.
USPTO Non-Final Rejection for U.S. Appl. No. 11/395,417 dated Apr. 25, 2008; 7 pages.
USPTO Non-Final Rejection for U.S. Appl. No. 11/395,417 dated Oct. 26, 2006; 13 pages.
International Search Report and Written Opinion of the International Searching Authority for International Application No. PCT/US08/06627, filed on May 23, 2008 and mailed on Aug. 26, 2008.
"CSD User Module Data Sheet," CSD v1.0, Oct. 23, 2006; 58 pages.
"Sigma-Delta ADCs and DACs, An-283 Application Note, Analog Devices," 1993; Downloaded from <http://www.analog.com/UpoloadedFiles/Application_Notes/292524291525717245054923680458171AN283.pdf>; 16 pages.
"The Virtual Keyboard: I-Tech Bluetooth/Serial Virtual Laser Keyboard Available Now!" The Virtual Laser Keyboard (VKB) Online Worldwide Shop, <http://www.virtual-laser-keyboard.com>, downloaded Apr. 13, 2006; 4 pages.
Andrew S. Tanebaum with contributions from James R. Goodman, "Structured Computer Organization", 1999, Prentice Hall, Fourth Edition, pp. 264-288, 359-362.
U.S. Appl. No. 11/709,866: "Input/Output Multiplexer Bus," Dennis R. Sequine, filed Feb. 21, 2007; 33 pages.
U.S. Appl. No. 13/306,840: "Input/Output Multiplexer Bus," Dennis R. Seguine, filed Nov. 29, 2011; 24 pages.
Chris Mack, "Semiconductor Lithography—The Basic Process," Gentleman Scientist, downloaded Apr. 20, 2006, http://www.lithoguru.com/scientist/lithobasics.html; 12 pages.
Cypress Semiconductor Corporation, "FAN Controller CG6457AM and CG6462AM," PSoC Mixed Signal Array Preliminary Data Sheet; May 24, 2005; 25 pages.
Cypress Semiconductor Corporation, "PSoC CY8C20x34 Technical Reference Manual (TRM)," PSoC CY8C20x34 TRM, Version 1.0, 2006; 218 pages.
Cypress Semiconductor Corporation, "Release Notes srn017," Jan. 24, 2007; 3 pages.
Dave Van Ess, "Understanding Switched Capacitor Analog Blocks," Application Note AN2041, Mar. 30, 2004; 16 pages.
Dennis Seguine, "Capacitive Switch Scan," AN2233a, Application Note, CY8C21x34, Apr. 7, 2005; 6 pages.
Janusz Mlodzianowski, "A Simple Multipurpose Logic Analyzer," Dec. 1997, Circuit Cellar Ink, Issue 89, pp. 28-36.
Larry K. Baxter, "Capacitive Sensors, Design and Applications," IEEE Press, The Institute of Electrical and Electronics Engineers Inc., Aug. 1996, pp. 177-187; 12 pages.
Lee, Mark; "EMC Design Considerations for PSoC CapSense Applications," Cypress Semiconductor Corporation, Application Note AN2318; Sep. 16, 2005; 6 pages.
Mark Lee, "CapSense Best Practices," Cypress Semiconductor Application Note, Oct. 16, 2006; 10 pages.
Milton Ohring, "The Materials Science of Thin Films: Deposition and Structure," 2nd Edition, Academic Press, 2002, pp. 336-337; 4 pages.
Min et al., "Offset Compensation of Capacitive Sensors for Electrostatic Microactuators," ISIE 2001, Pusan Korea, pp. 2114-2117.
Sangil Park, "Motorola Digital Signal Processors, Principles of Sigma-Delta Modulation for Analog-to-Digital Converters," Rev. 1, downloaded from <http://digitalsignallabs.com/SigmaDelta.pdf>, Mar. 1997; 64 pages.
Seguine, Ryan; "Layout Guidelines for PSoC CapSense," Cypress Semiconductor Corporation, Application Note AN2292; Jul. 22, 2005; 13 pages.
Ted Tsui, "Migrating from CSR to CSD," Cypress Semiconductor Corporation, Application Note AN2408, Feb. 8, 2007, http://www.cypress.com.
The Authoritative Dictionary of IEEE Standards Terms, 2000, IEEE Press Publications, 7th Edition, pp. 1133-1134; 4 pages.

* cited by examiner

METHODS AND CIRCUITS FOR MEASURING MUTUAL AND SELF CAPACITANCE

CROSS REFERENCE TO RELATED APPLICATIONS

This application is a continuation of and claims benefit to pending U.S. patent application Ser. No. 12/395,462, filed Feb. 27, 2009, which is a non provisional of and claims the benefit of U.S. Provisional Patent Application No. 61/067,539 filed Feb. 27, 2008, all of which are incorporated by reference herein in their entirety.

TECHNICAL FIELD

The present invention relates generally to touch sensors and, more particularly, to capacitive touch sensors.

BACKGROUND

Capacitive touch sensors may be used to replace mechanical buttons, knobs and other similar mechanical user interface controls. The use of a capacitive sensor allows for the elimination of complicated mechanical switches and buttons, providing reliable operation under harsh conditions. In addition, capacitive sensors are widely used in modern customer applications, providing new user interface options in existing products.

BRIEF DESCRIPTION OF THE DRAWINGS

Embodiments are illustrated by way of example and are not intended to be limited by the figures of the accompanying drawings, in which like references indicate similar elements and in which.

DETAILED DESCRIPTION

In the following description, for purposes of explanation, numerous specific details are set forth in order to provide a thorough understanding of the present invention. It will be evident, however, to one skilled in the art that the present invention may be practiced without these specific details. In other instances, well-known circuits, structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment.

A capacitive sensor may be characterized by a base capacitance that includes a self capacitance component and a mutual capacitance component. Since the values of these capacitance components affect the operation of the capacitive touch sensor and may vary from one capacitive sensor to another, a capacitive sensing circuit may benefit from the capability of independently measuring the self and mutual capacitances of a capacitive sensor.

Apparatus for and methods of measuring mutual and self capacitance in a capacitive touch sensor are described. The apparatus and methods described herein may be used in capacitive touch detection systems such as, for example, capacitive touch screens and, in particular, with capacitive touch screens having multiple simultaneous touch detection capabilities. Alternatively, the apparatus and methods described herein may be used with single touch detection systems or other types of capacitive touch system.

Figure 1:
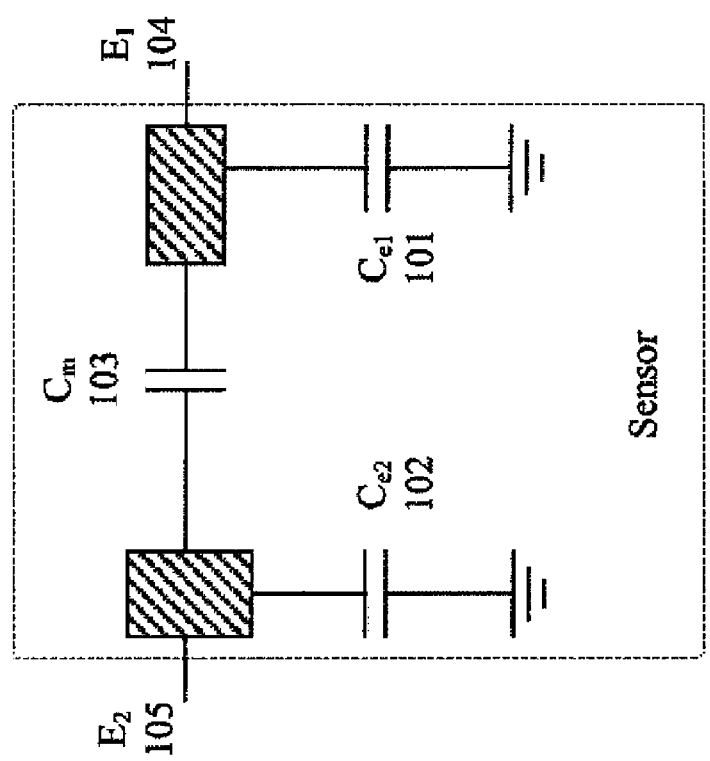
FIG. 1 illustrates alternative models of two electrodes situated close to each other, according to one embodiment.

Embodiments of the present invention allow for measurement of two or more electrodes' mutual and self capacitance separately. Capacitance measurement can be performed with a single pair of electrodes or with the use of a multiple electrode system. Alternative models of two electrodes situated close to each other are shown at FIG. 1, where $C_{e1}$ 101 and $C_{e2}$ 102 are electrode self capacitances, and $C_m$ 103 is the mutual capacitance between the two electrodes $E_1$ 104 and $E_2$ 105.

Figure 2:
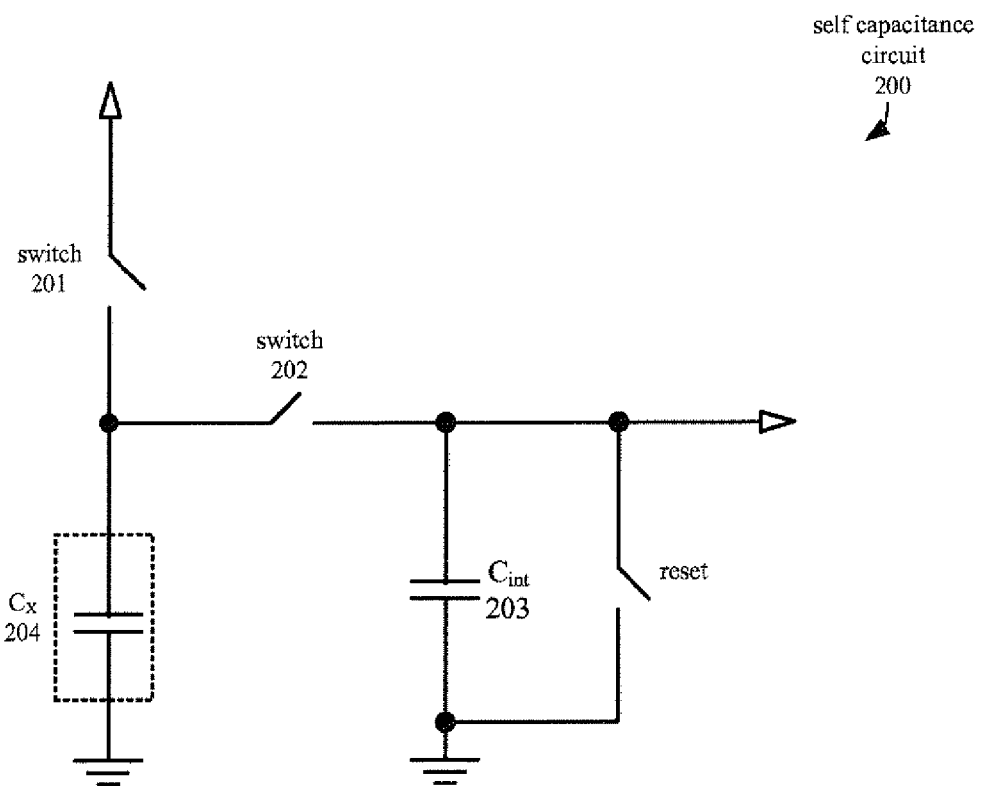
FIG. 2 illustrates one embodiment of a self-capacitance circuit that uses a charge accumulation technique.

There are various circuit implementations that may be used for performing capacitance measurement. FIG. 2 illustrates a self-capacitance circuit 200 that uses a charge accumulation technique to measure the capacitance $C_X$ 204. A charge accumulation technique operates in the following way: initially the integration capacitor is reset by turning on the reset signal for some time. After reset, the switches 201 and 202 start operation in the two non-overlapping phases. The voltage on $C_{int}$ 203 starts increasing. The sensing capacitance is determined by the number of switching cycles used to get the integrator capacitor voltage to some threshold value.

With such a charge accumulation technique, the voltage on the integration capacitance rises exponentially with respect to time (which can be measured by the cycle count). This relationship can be linearized for measurement methods where capacitance is calculated as a function of integration capacitor voltage after a predefined number of cycles. Also, the mutual capacitance measurement scheme has some sensitivity to the sensor self capacitance, which decreases the measurement accuracy.

Figure 3:
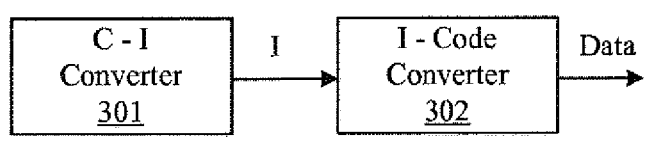
FIG. 3 illustrates a block diagram of an apparatus for measuring mutual or self capacitance, according to one embodiment.

FIG. 3 illustrates a block diagram of a capacitance measurement circuit for measuring mutual or self capacitance, according to one embodiment of the present invention. The apparatus illustrated in FIG. 3 can be used for separately measuring mutual or self sensor capacitances. In order to measure a mutual capacitance, the $C_e1$, $C_e2$ capacitance influence should be excluded. This can be accomplished by charging and discharging the $C_e2$ electrode from a low-impedance voltage source and keeping the voltage of the $C_e1$ electrode close to constant to minimize the influence of its charge-discharge current. In order to measure the self-capacitance (of $C_e1$ or $C_e2$) the voltage change across $C_m$ should be kept to zero to minimize the influence of this capacitance on the measurement results.

The capacitance measurement circuit 300 can be separated into two parts: the switching capacitor front-end capacitance to current (C-I) converter 301, and the back-end current to digital value (I-code) converter 302, as illustrated in FIG. 3. In the following description, the front-end and back-end circuits are described separately. A switching capacitor front-end converts the sensing capacitance to current pulses (C-I Converter). The back-end system averages the current and converts it into readable digital values (I-Code Converter). The circuits described herein are based on a switching capacitor technique in capacitance to current converter circuits.

Figure 4A:
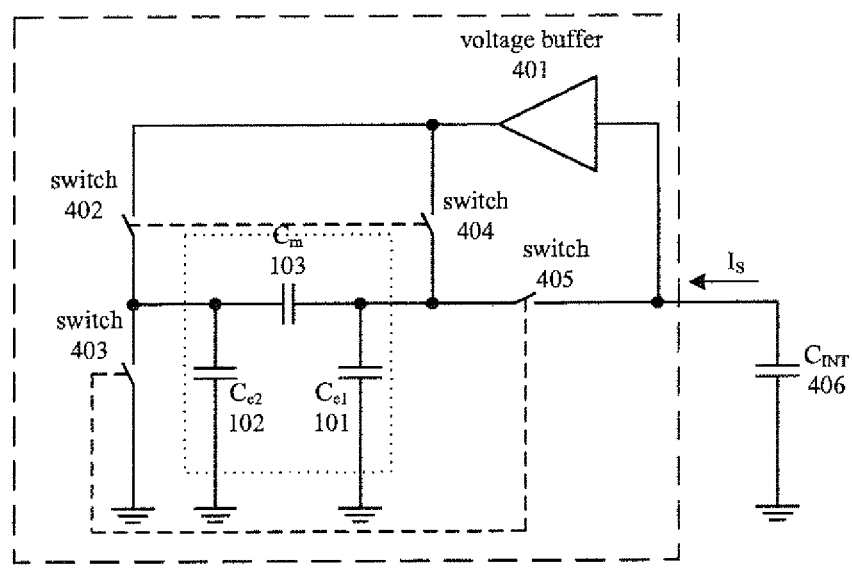
FIG. 4A illustrates one embodiment of a capacitance to current sink converter having an integration capacitor coupled to ground.
Figure 4B:
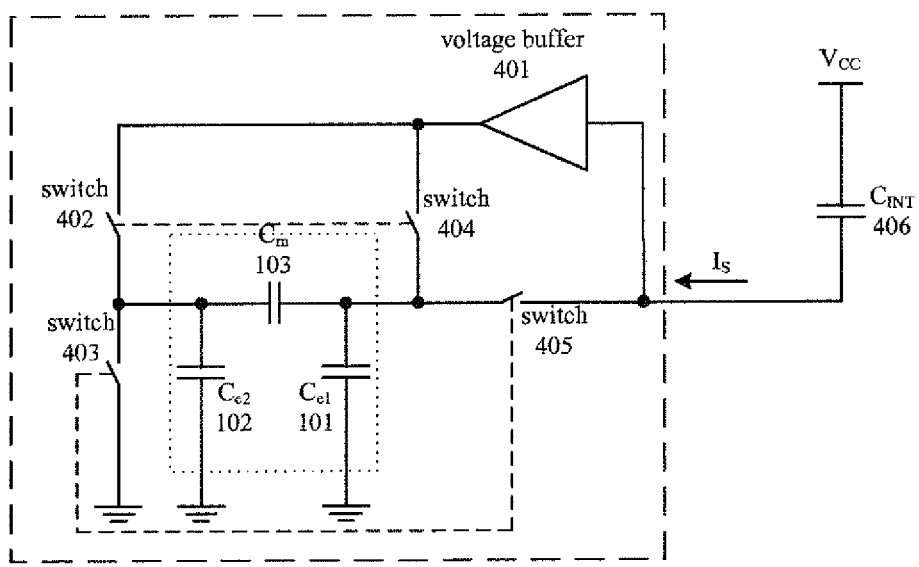
FIG. 4B illustrates one embodiment of a capacitance to current sink converter having an integration capacitor coupled to a high voltage supply potential.

FIGS. 4A, 4B, 5A and 5B show different embodiments for a capacitance to current converter (CTC or C-I Converter) for mutual capacitance measurement. In the following figures, a voltage buffer 401 resides between the integration capacitor $C_{int}$ 406 and the switches 402, 404 connecting to the mutual electrodes of the CTC. It should be noted that the integration capacitor $C_{int}$ 406 is considered as part of the current measurement system and shown here for ease of explanation. The integration capacitor 406 can be connected between the converter output and a fixed potential net, for example, GND and Vcc, as illustrated in FIGS. 4A and 4B respectively.

The operation of the circuit may be described in several stages, which are repeated in cycle. Table 1 contains the switching sequence of switches for the circuits shown in FIGS. 4A and 4B.

TABLE 1

Switching sequence of switches shown in FIGS. 4A and 4B.

| Stage | Switch 402 | Switch 403 | Switch 404 | Switch 405 | $U_{Cint}$, $U_{Ce1}$, $U_{Ce2}$, $U_{Cm}$ |
|---|---|---|---|---|---|
| 1 | OFF | OFF | OFF | OFF | $U_{Cint} = U_0$ |
| 2 | ON | OFF | ON | OFF | $U_{Cm} = 0$, $U_{Ce1} = U_{Ce2} = U_{Cint} = U_{buf}$ |
| 3 | OFF | OFF | OFF | OFF | $U_{Cm} = 0$, $U_{Ce1} = U_{Ce2} = U_{Cint}$ |
| 4 | OFF | ON | OFF | ON | $U_{Cm} = U_{Cint} = U_{Ce1}$, $U_{Ce2} = 0$ |
| 5 | OFF | OFF | OFF | OFF | $U_{Cm} = U_{Ce1}$, $U_{Ce2} = 0$ |

Figure 5A:
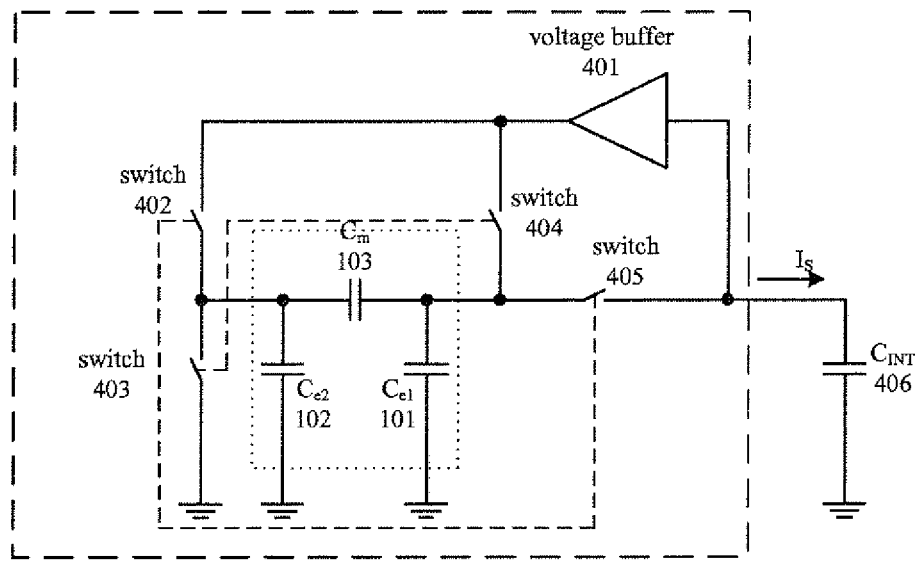
FIG. 5A illustrates one embodiment of a capacitance to current sink converter having an integration capacitor coupled to ground.
Figure 5B:
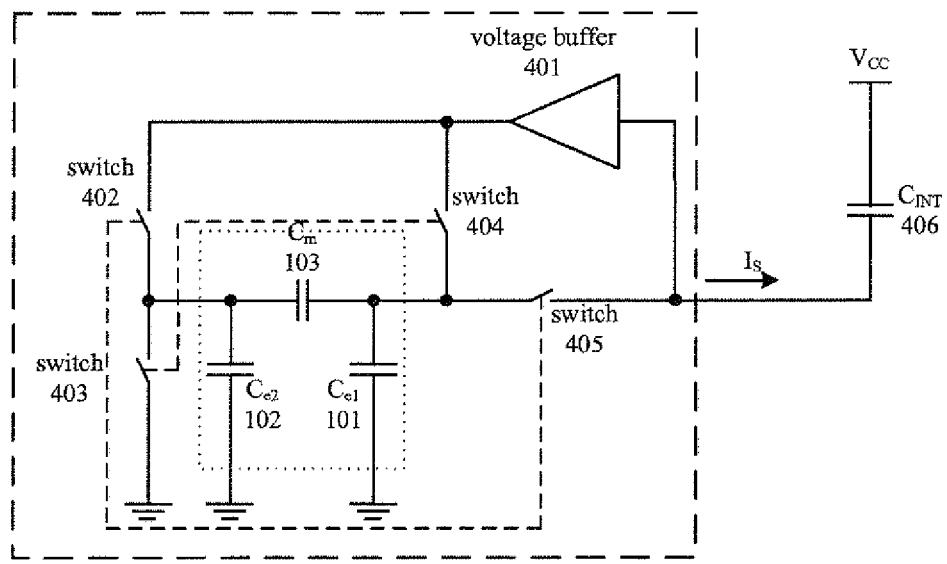
FIG. 5B illustrates one embodiment of a capacitance to current sink converter having an integration capacitor coupled to a high voltage supply potential.

Table 2 contains the switching sequence of switches for the circuits shown in FIGS. 5A and 5B.

TABLE 2

Switching sequence of switches shown in FIGS. 5A and 5B.

| Stage | Switch 402 | Switch 403 | Switch 404 | Switch 405 | $U_{Cint}$, $U_{Ce1}$, $U_{Ce2}$, $U_{Cm}$ |
|---|---|---|---|---|---|
| 1 | OFF | OFF | OFF | OFF | $U_{Cint} = U_0$ |
| 2 | OFF | ON | ON | OFF | $U_{Cm} = U_{buf} = U_{Cint} = U_{Ce1}$ |
| 3 | OFF | OFF | OFF | OFF | $U_{Cm} = U_{Cint} = U_{Ce1}$ |
| 4 | ON | OFF | OFF | ON | $U_{Cm} = 0$, $U_{Ce1} = U_{Cint}$, $U_{Ce2} = U_{Cint}$ |
| 5 | OFF | OFF | OFF | OFF | $U_{Cm} = 0$, $U_{Ce1} = U_{Cint}$, $U_{Ce2} = U_{Cint}$ |

The stages from 2 to 5 are performed in cycles. In effect, the circuits shown in FIGS. 4A and 4B act as current sinks, and the circuits shown in FIGS. 5A and 5B act as current sources. The integration capacitor $C_{int}$ 406 is external to the CTC and is not part of the current measurement circuit.

Figure 6:
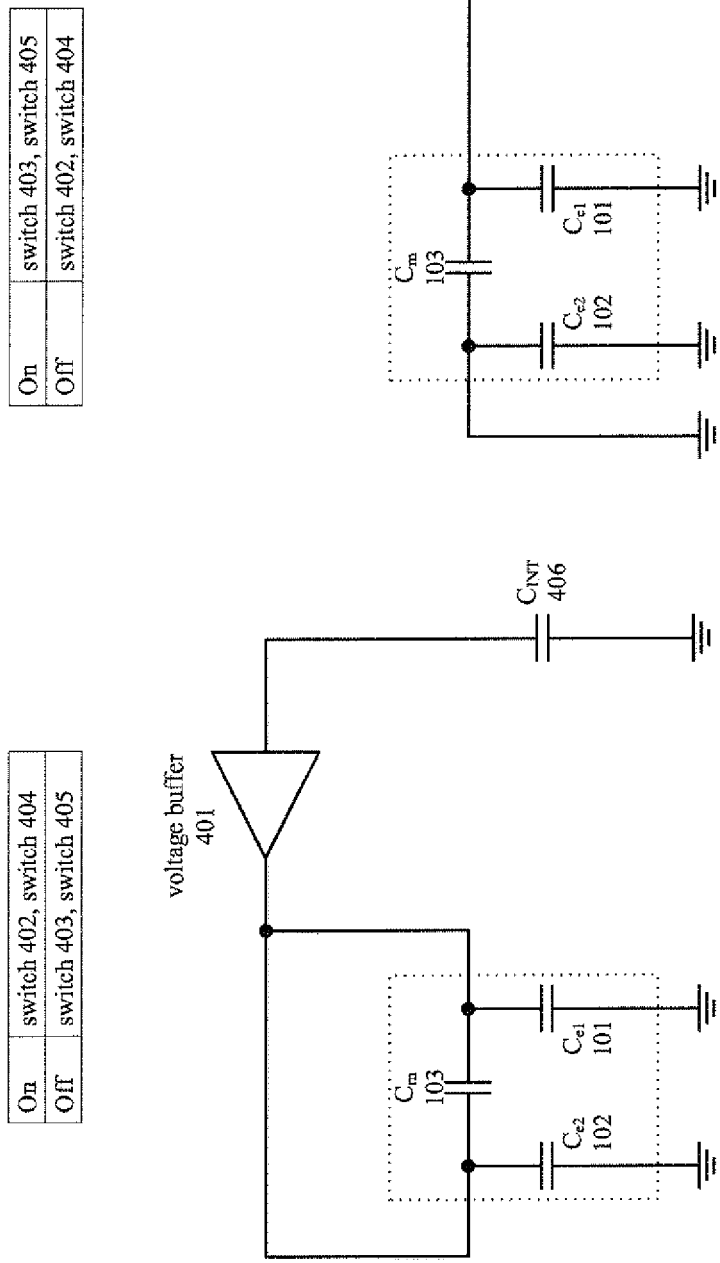
FIG. 6 illustrates phases of a converter operation, according to one embodiment.

FIG. 6 illustrates one embodiment of the operation phases for the circuits shown in FIGS. 4A and 4B. During the first phase, both ends of the $C_m$ 103 are connected to voltage buffer 401. During the second phase, the left $C_m$ terminal is grounded and the right terminal is connected to the integration capacitor $C_{int}$ 406.

For both circuits, an averaged absolute current sink/source ($I_s$) value can be calculated by Equation 1:

$$I_S = f_{sw} \cdot U_{C\,int} \cdot C_m \qquad (1)$$

where, $f_{SW}$ is the switching frequency of phases 2-5 repeating. It should be noted that the capacitance of $C_e2$ electrode 102 is shunted by switch 402 or 403 in each operation phase and does not have an impact on the output current. The capacitance of the $C_{e1}$ electrode 101 has a potential equal to $U_{Cint}$ during both charge transfer stages and is not recharged between different operation phases. Therefore, the output current is determined by the value of $C_m$ 103.

A special case of the current converter operation is now considered, when it is loaded by stand-alone integration capacitor $C_{int}$ 406. In this case, the relationship between the voltage change on $U_{Cint}$ and the cycles count N has a nonlinear exponential character, as expressed in Equation 2:

$$U_{Cint}^N = U_{Cint}^0 \cdot \left(1 - \frac{C_m}{C_{int}}\right)^N \quad \left(U_{Cint}^N \approx U_{Cint}^0 \cdot e^{-N\frac{C_m}{C_{int}}}\right) \quad (2)$$

where, N is the quantity of conversion cycles and $C_{Cint}^0$ is the voltage on the integration capacitor 406 at the initial time.

The exponential character of this dependence is caused by the positive voltage feedback via buffer 401: increasing voltage on the integration capacitor 406 causes a larger charge quantum being added in each phase and an increase in the speed of the integration capacitor 406 voltage rising. This may be considered as drawback in some applications, especially when the current measurement circuit does not keep a voltage on the integration capacitor 406 constant.

Figure 7A:
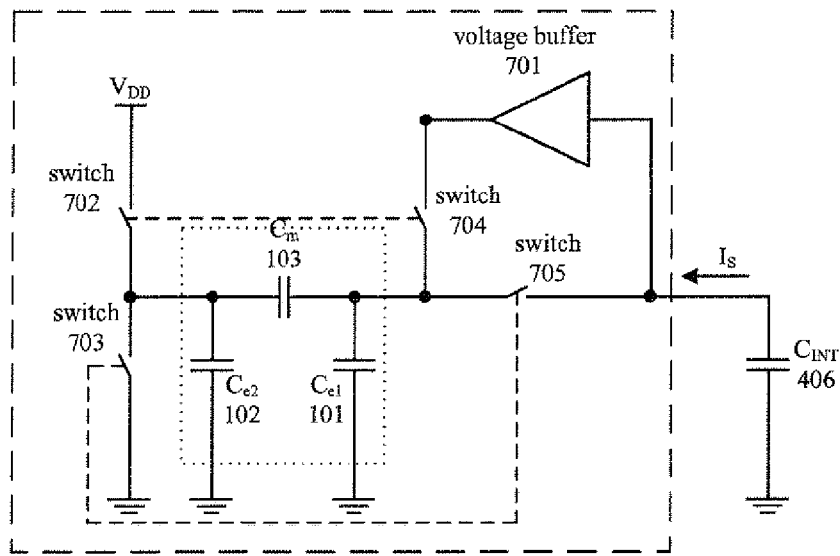
FIG. 7A illustrates one embodiment of a capacitance to current sink converter used for mutual capacitance measurement, having an integration capacitor coupled to ground.
Figure 7B:
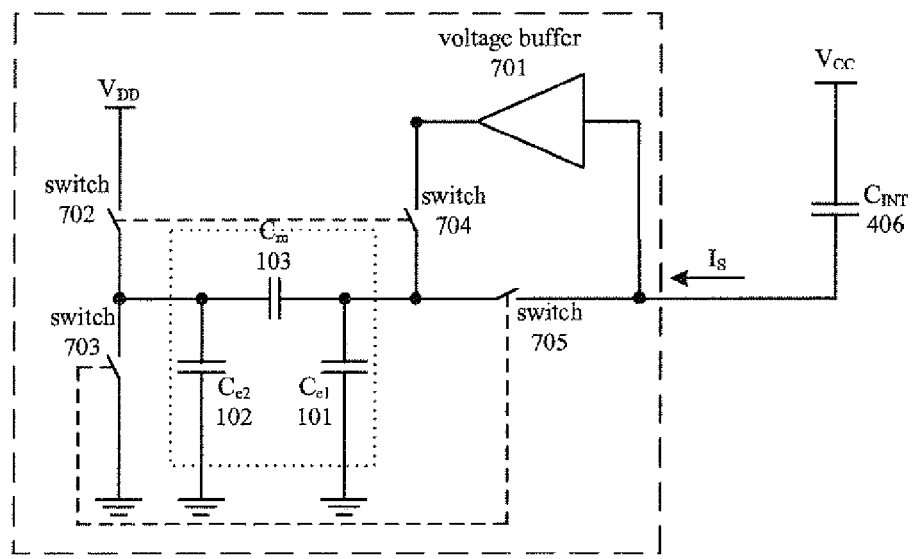
FIG. 7B illustrates one embodiment of a capacitance to current sink converter used for mutual capacitance measurement, having an integration capacitor coupled to $V_{CC}$.

To avoid this drawback, the circuit embodiments illustrated in FIGS. 7A, 7B, 8A, and 8B may be used. The difference between the circuit embodiments illustrated in FIGS. 7A, 7B, 8A, and 8B, versus those illustrated in FIGS. 4A, 4B, 5A, and 5B, is that the right terminal of $C_m$ 103 is connected to the fixed voltage source $V_{DD}$ instead of the floating buffer output voltage of the analog buffer 701. Only the switch 702 connection is changed on the circuits illustrated in FIGS. 7A, 7B, 8A, and 8B. The switching sequence of the switches illustrated in FIGS. 7A and 7B is shown in Table 3 below.

TABLE 3

Switching sequence of switches in FIGS. 7A and 7B.

| Stage | Switch 702 | Switch 703 | Switch 704 | Switch 705 | $U_{Cint}, U_{Ce1}, U_{Ce2}, U_{Cm}$ |
|---|---|---|---|---|---|
| 1 | OFF | OFF | OFF | OFF | $U_{Cint} = U_0$ |
| 2 | ON | OFF | ON | OFF | $-U_{Cm} = U_{Vdd} - U_{Cint}$, $U_{Ce1} = U_{Cint} = U_{buf}$, $U_{Ce2} = U_{Vdd}$ |
| 3 | OFF | OFF | OFF | OFF | $U_{Cm} = U_{Vdd} - U_{Cint}$, $U_{Ce1} = U_{Cint}$, $U_{Ce2} = U_{Vdd}$ |
| 4 | OFF | ON | OFF | ON | $U_{Cm} = U_{Cint} = U_{Ce1}, U_{Ce2} = 0$ |
| 5 | OFF | OFF | OFF | OFF | $U_{Cm} = U_{Ce1}, U_{Ce2} = 0$ |

Figure 8A:
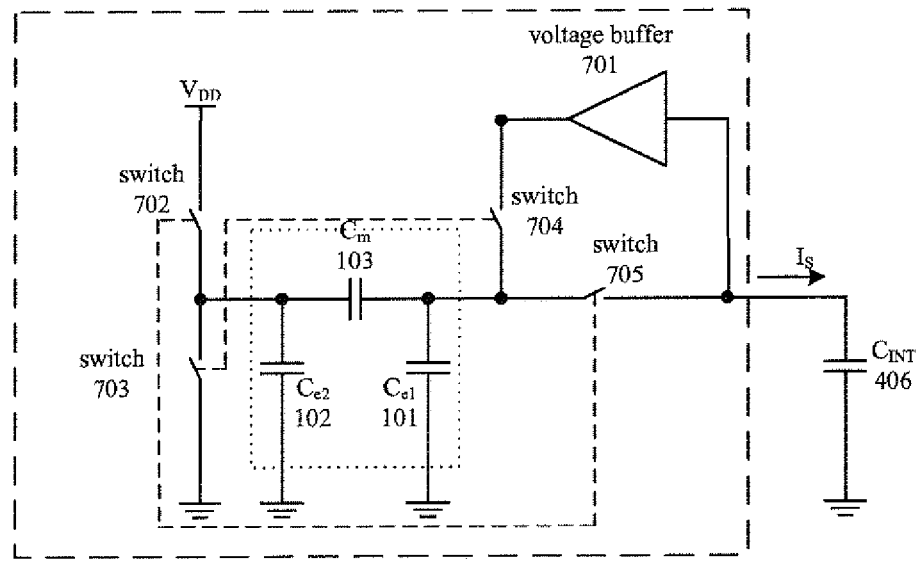
FIG. 8A illustrates one embodiment of a capacitance to current source converter having an integration capacitor coupled to ground.
Figure 8B:
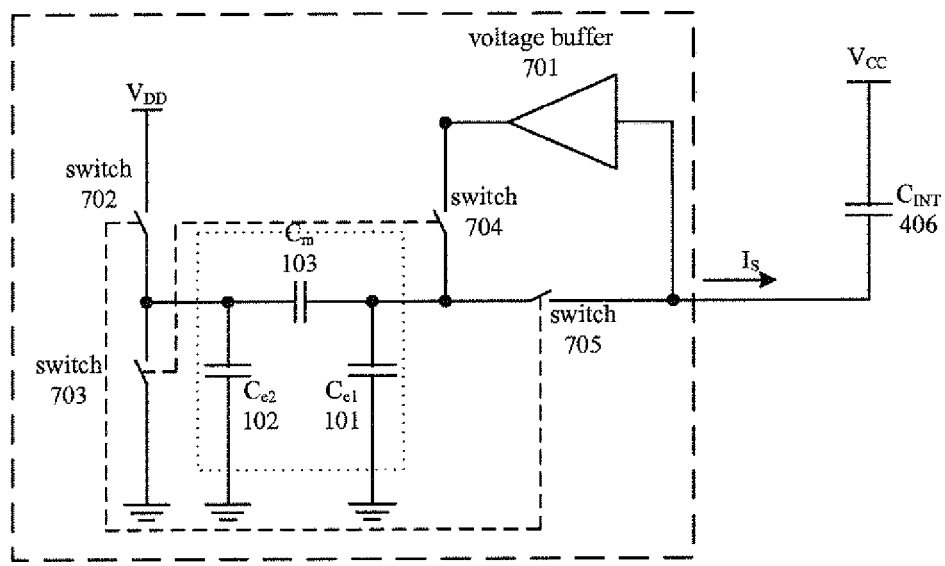
FIG. 8B illustrates one embodiment of a capacitance to current source converter having an integration capacitor coupled to a high voltage supply potential.

The switching sequence of the switches illustrated in FIGS. 8A and 8B is shown by Table 4 below.

TABLE 4

Switching sequence of switches in FIGS. 8a and 8b

| Stage | Switch 702 | Switch 703 | Switch 704 | Switch 705 | $U_{Cint}, U_{Ce1}, U_{Ce2}, U_{Cm}$ |
|---|---|---|---|---|---|
| 1 | OFF | OFF | OFF | OFF | $U_{Cint} = U_0$ |
| 2 | OFF | ON | ON | OFF | $U_{Cm} = U_{buf} = U_{Cint} = U_{Ce1}$ |
| 3 | OFF | OFF | OFF | OFF | $U_{Cm} = U_{Cint} = U_{Ce1}$ |
| 4 | ON | OFF | OFF | ON | $-U_{Cm} = U_{Vdd} - U_{Cint}, U_{Ce1} = U_{Cint}, U_{Ce2} = U_{Vdd}$ |

TABLE 4-continued

Switching sequence of switches in FIGS. 8a and 8b

| Stage | Switch 702 | Switch 703 | Switch 704 | Switch 705 | $U_{Cint}, U_{Ce1}, U_{Ce2}, U_{Cm}$ |
|---|---|---|---|---|---|
| 5 | OFF | OFF | OFF | OFF | $U_{Cm} = 0, U_{Ce1} = U_{Cint}, U_{Ce2} = U_{Vdd}$ |

The stages from 2 to 5 are performed in cycles. As a result, the average current flowing out of the $C_{int}$ 406 capacitor for the circuits on FIGS. 7A, 7B, 8A, and 8B can be calculated by Equation 3:

$$I_S = f_{sw} \cdot U_{Vdd} \cdot C_m \quad (3)$$

For the given values of $f_{sw}$ and $V_{DD}$ parameters, the output current $(I_s)$ linearly depends only on $C_m$ and is proportional to $f_{sw}$ and $V_{DD}$. The change of current direction is done by a change of the switches' operation phases. If the current measurement subsystem does not load the integration capacitor $C_{int}$ 406, a voltage on this capacitor changes linearly with the number of cycles N, as expressed in Equation 4:

$$U_{Cint}^N = U_{Vdd} \cdot \left(1 - N \cdot \frac{C_m}{C_{int}}\right) \quad (4)$$

A similar Equation 5 is used for describing the circuits illustrated in FIGS. 8A and 8B:

$$U_N = N \cdot U_{Vdd} \cdot \frac{C_m}{C_{int}} \quad (5)$$

The circuit embodiments described above may be used for self-capacitance measurement with minimal hardware changes by routing the buffer signal to the right side switches. To do this, the switches voltages may be adjusted in such way that the voltage change on the mutual capacitance $C_m$ is equal to zero between different phases. In other circuit configurations, the voltage on $C_e2$ is kept constant but the voltage on $C_m$ is varied. In the circuit embodiments illustrated in FIGS. 7A, 7B, 8A, and 8B, the voltage on $C_e2$ is varied and the voltage on $C_m$ is kept constant.

Figure 9A:
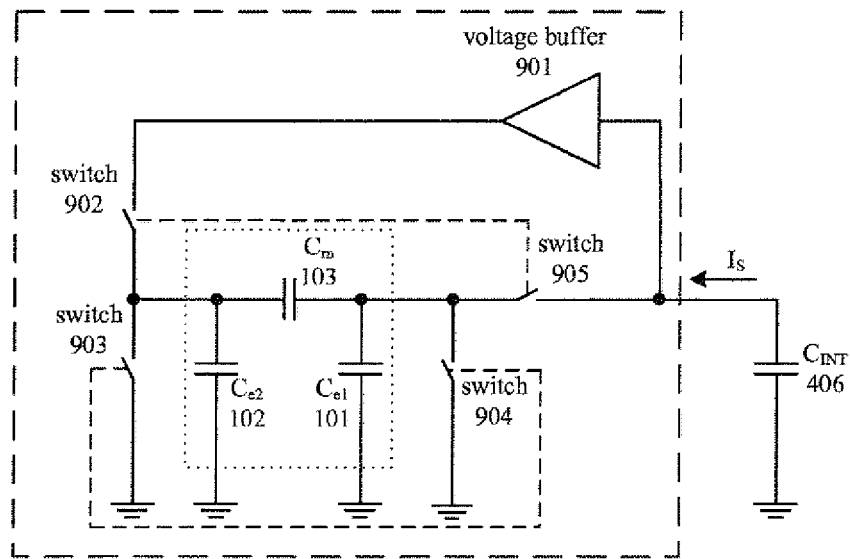
FIG. 9A illustrates one embodiment of a capacitance to current sink converter used for self capacitance measurement, having an integration capacitor coupled to ground.
Figure 9B:
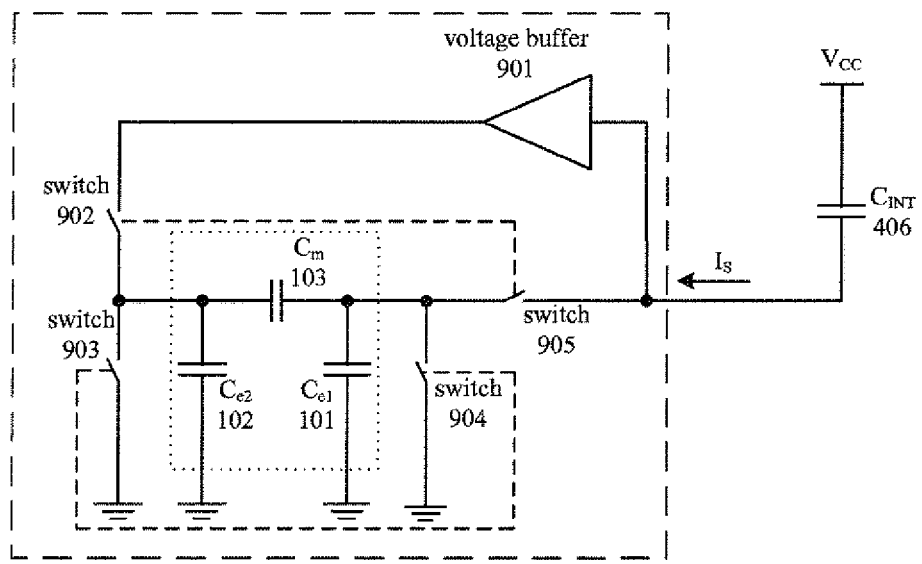
FIG. 9B illustrates one embodiment of a capacitance to current sink converter used for self capacitance measurement, having an integration capacitor coupled to a high voltage supply potential.

FIGS. 9A and 9B illustrate embodiments of a capacitance to current sink converter for self capacitance measurement. As previously noted, the integration capacitor $C_{int}$ 406 is considered part of the current measurement system and is shown here for ease of explanation. The integration capacitor 406 can be connected between the converter output and any fixed potential net, for example, GND and $V_{CC}$, as illustrated in FIGS. 9A and 9B respectively. Alternatively, the integration capacitor 406 can be connected between the converter output and other fixed potentials. The switching sequence of switches illustrated in the circuit of FIGS. 9A and 9B is shown in Table 5 below.

TABLE 5

Switching sequence of switches illustrated in FIGS. 9A, 9B.

| Stage | Switch 902 | Switch 903 | Switch 904 | Switch 905 | $U_{Cint}, U_{Ce1}, U_{Ce2}, U_{Cm}$ |
|---|---|---|---|---|---|
| 1 | OFF | OFF | OFF | OFF | $U_{Cint} = U_0$ |
| 2 | OFF | ON | ON | OFF | $U_{Ce1} = U_{Ce2} = 0, U_{Cm} = 0$ |
| 3 | OFF | OFF | OFF | OFF | $U_{Ce1} = U_{Ce2} = 0, U_{Cm} = 0$ |

TABLE 5-continued

Switching sequence of switches illustrated in FIGS. 9A, 9B.

| Stage | Switch 902 | Switch 903 | Switch 904 | Switch 905 | $U_{Cint}, U_{Ce1}, U_{Ce2}, U_{Cm}$ |
|---|---|---|---|---|---|
| 4 | ON | OFF | OFF | ON | $U_{e1} = U_{Cint} = U_{Ce2}$, $U_{Cm} = 0$ |
| 5 | OFF | OFF | OFF | OFF | $U_{e1} = U_{Cint} = U_{Ce2}$, $U_{Cm} = 0$ |

Figure 10A:
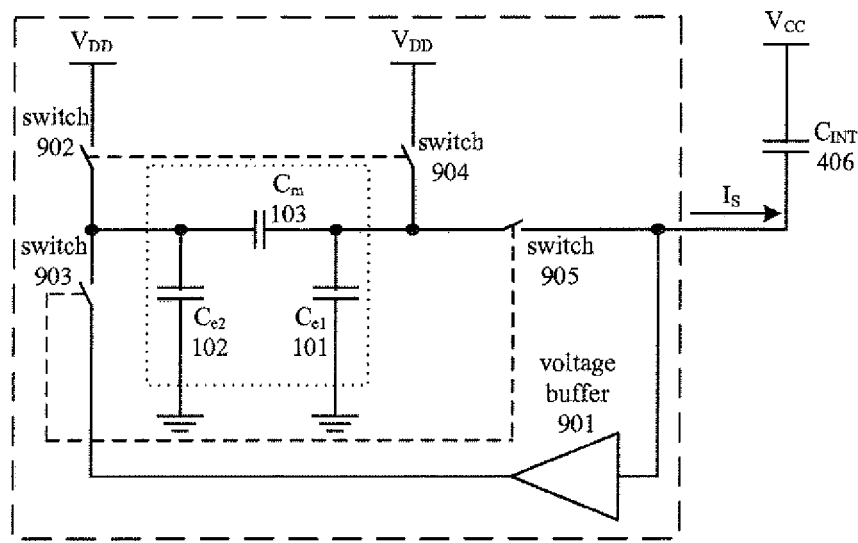
FIG. 10A illustrates one embodiment of a capacitance to current source converter used for self capacitance measurement, having an integration capacitor coupled to ground.
Figure 10B:
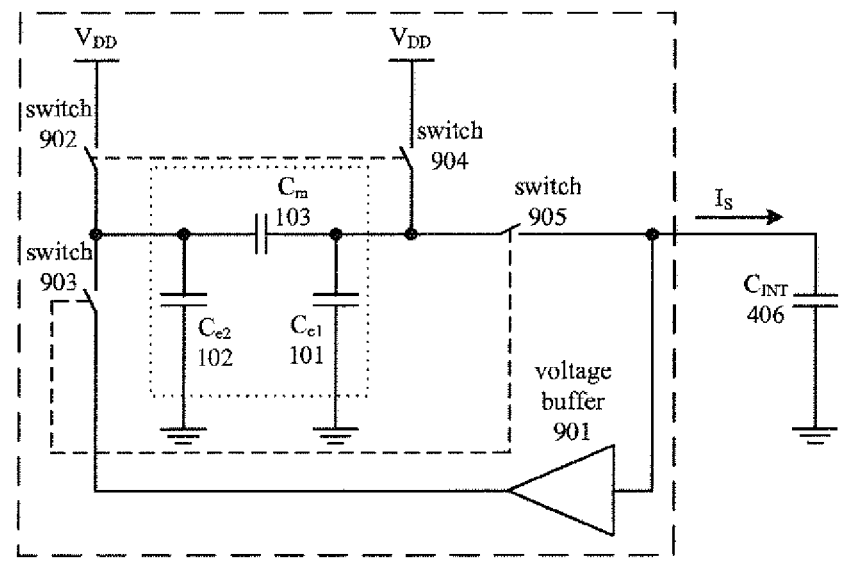
FIG. 10B illustrates one embodiment of a capacitance to current source converter used for self capacitance measurement, having an integration capacitor coupled to a high voltage supply potential.

The switching sequence of switches in FIGS. 10A and 10B is shown in Table 6 below.

TABLE 6

Switching sequence of switches illustrated in FIGS. 10A, 10B.

| Stage | Switch 902 | Switch 903 | Switch 904 | Switch 905 | $U_{Cint}, U_{Ce1}, U_{Ce2}, U_{Cm}$ |
|---|---|---|---|---|---|
| 1 | OFF | OFF | OFF | OFF | $U_{Cint} = U_0$ |
| 2 | ON | OFF | ON | OFF | $U_{Ce1} = U_{Ce2} = U_{Vdd}, U_{Cm} = 0$ |
| 3 | OFF | OFF | OFF | OFF | $U_{Ce1} = U_{Ce2} = U_{Vdd}, U_{Cm} = 0$ |
| 4 | OFF | ON | OFF | ON | $U_{e1} = U_{Cint} = U_{Ce2}, U_{Cm} = 0$ |
| 5 | OFF | OFF | OFF | OFF | $U_{e1} = U_{Cint} = U_{Ce2}, U_{Cm} = 0$ |

Stages 2 through 5 are performed in cycles. As a result, the average current flowing into capacitor $C_{int}$ for the circuits illustrated in FIGS. 9A and 9B is described by Equation 6 below:

$$I_S = f_{sw} \cdot U_{Cint} \cdot C_{e1} \quad (6)$$

The average current flowing out of $C_{int}$ capacitor for the circuits illustrated in FIGS. 10A and 10B are described by Equation 7:

$$I_S = f_{sw} \cdot (U_{Vdd} - U_{Cint}) \cdot C_{e1} \quad (7)$$

The potential difference on electrode capacitor $C_m$ 103 is equal to approximately zero during the stages of charge transfer and does not have an impact on the measurement. The $C_e2$ electrode 102 capacitance is switched off by switches 902 and 904 during the stages of operation. In this case, the relationship between the voltage change on $U_{Cint}$ and the cycle count N has a nonlinear exponential character for the circuits illustrated in FIGS. 9A and 9B, in accord with Equation 8 below:

$$U_{Cint}^N = U_{Cint}^0 \cdot \left(1 - \frac{C_{e1}}{C_{int}}\right)^N \quad (8)$$

Equation 9 below similarly describes the circuits illustrated in FIGS. 10A and 10B:

$$U_{Cint}^N = U_{Vdd} \cdot \left(1 - e^{-N\frac{C_{e1}}{C_{int}}}\right) \quad (9)$$

Various alternative variants of the conversion circuits described above may be used, including, for example:

Time measurement of the integration capacitor voltage threshold crossing;

Current integration using current integrator on the operational amplifier;

Converting current-to-voltage the operational amplifier and measuring the voltage using the ADC; and Sigma-delta modulator circuits.

Figure 11:
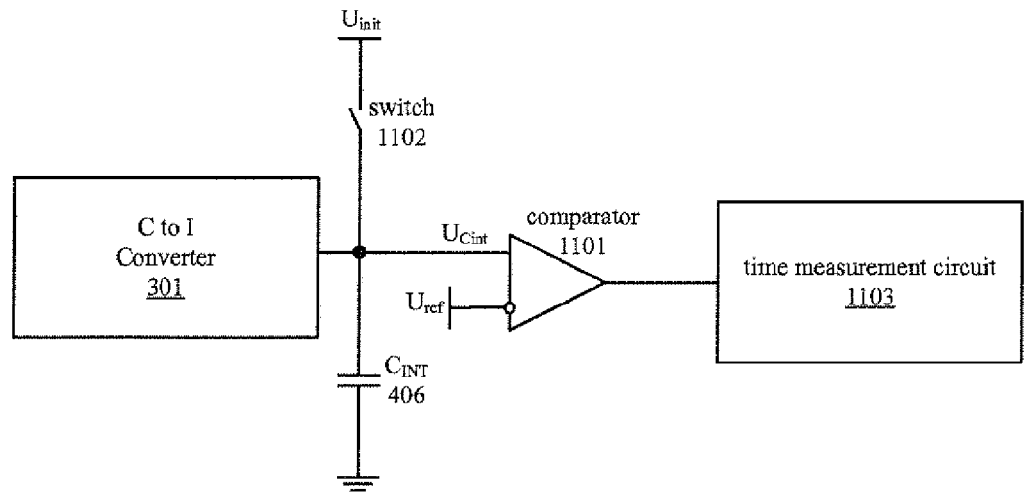
FIG. 11 illustrates one embodiment of an interval timer method for capacitance measurement.

FIG. 11 illustrates an interval timer method for capacitance measurement. In the circuit of FIG. 11, the integrator consists of a capacitor 406. The circuit of FIG. 11 operates in the following way. Initially, the voltage of integration capacitor 406 is set to $U_{init}$ by turning on, for some time period, a switch 1102. The comparator 1101 is used as threshold circuit and compares the voltage on the integration capacitor 406 with a reference voltage $U_{ref}$. The capacitance is measured by the time measurement circuit 1103 as the time elapsed (in the cycles count) until the comparator 1101 is triggered. The time is inversely proportional to the converter current. It should be noted that for switching capacitor current sink schemes, an integrator initial voltage ($U_{init}$) is set higher than the threshold voltage ($U_{ref}$). For the current source schemes, the integrator initial voltage is lower than threshold voltage $U_{ref}$.

Figure 12:
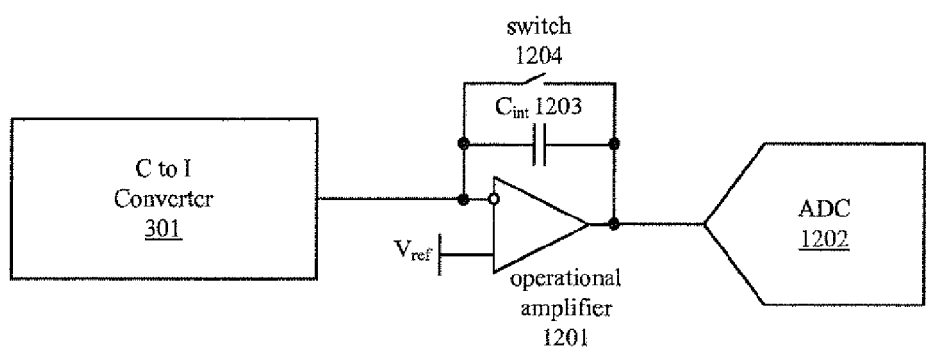
FIG. 12 illustrates one embodiment of a resettable current integrator with an operation amplifier and an analog-to-digital converter (ADC)

For more accurate current conversion, circuits based on current-to-voltage converters and current integrators may be used, as illustrated in the following figures. FIG. 12 illustrates one embodiment of a resettable current integrator (where integration capacitor 1203 can be reset using switch 1204) with an operational amplifier 1201 and an analog-to-digital converter (ADC) 1202. The ADC 1202 is used for integrator voltage measurement after the completion of a predefined number of integration cycles.

Figure 13:
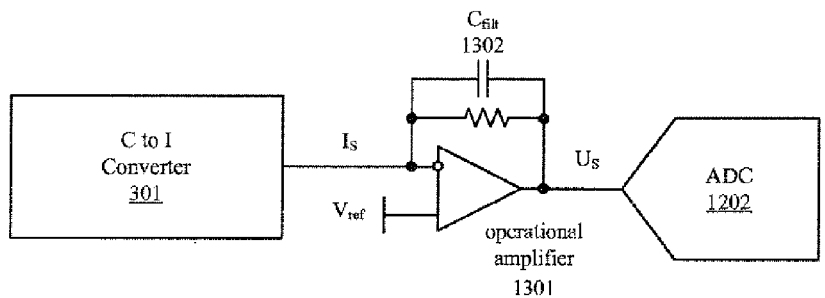
FIG. 13 illustrates one embodiment of a current-to-voltage converter built around an operational amplifier.
Figure 14:
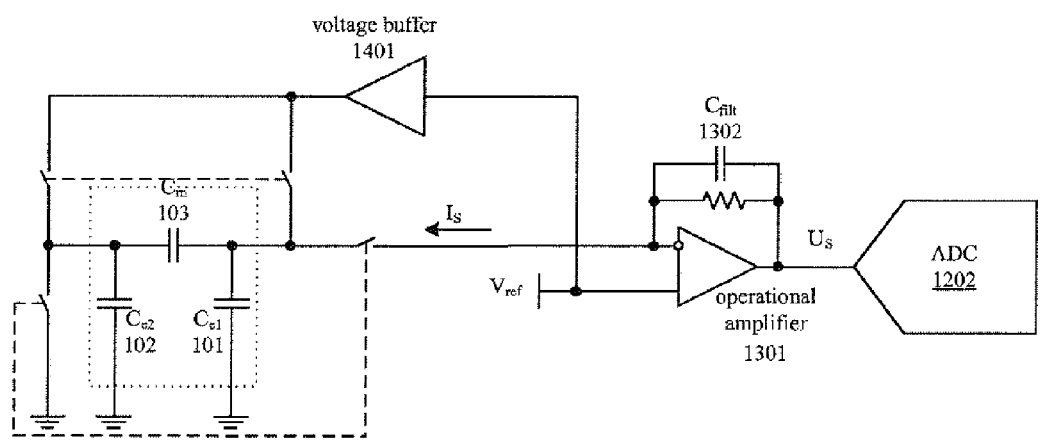
FIG. 14 illustrates one embodiment of a capacitance to current converter with a conversion circuit.

FIG. 13 illustrates one embodiment of a current-to-voltage converter built around an operational amplifier 1301. The converter of FIG. 13 also functions as a low pass filter (LPF) due to the presence of the filter capacitor $C_{filt}$ 1302 in the amplified feedback path. The output voltage $U_S$ is proportional to the input current $I_S$. The circuit of FIG. 13 operates continuously such that ADC conversion can be started any time after transient signals have stabilized. It should be noted that the buffer input inside the capacitance to code converter can be connected to the $V_{ref}$ net for the circuits illustrated in FIGS. 12 and 13, taking into account that both operational amplifier inputs have approximately the same potential. The schematic diagram of such a circuit configuration is illustrated in FIG. 14, where the input of voltage buffer 1401 is connected to the $V_{ref}$ net.

Figure 15:
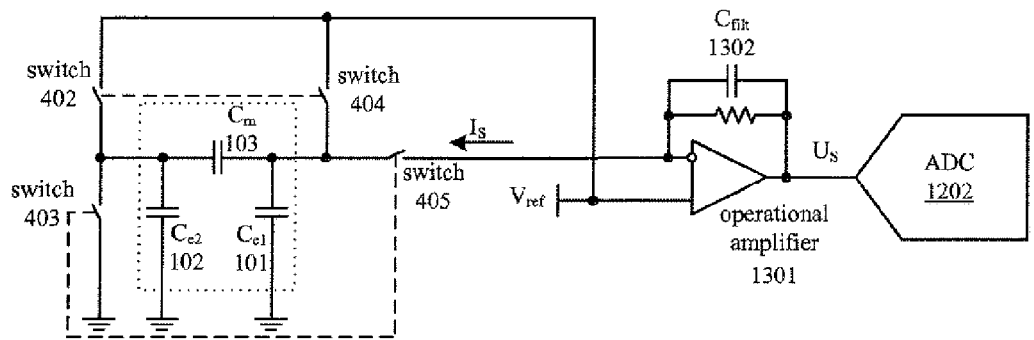
FIG. 15 illustrates one embodiment of a capacitance to current converter with a low pass filter.

In an alternative embodiment, when the $V_{ref}$ voltage source has an acceptable low output resistance, then the voltage buffer 1401 may be eliminated from the circuits illustrated herein. As an example, the circuit from FIG. 4 composed of the measurement circuit of FIG. 13 is illustrated in FIG. 15. Accordingly, FIG. 15 is an exemplary illustration of a capacitance to current converter with a low pass filter that can be implemented without a voltage buffer 1401 coupled to the reference voltage source $V_{ref}$. In one embodiment, the reference voltage $V_{ref}$ used to supply the switches in the capacitance to current converter is selected to be as close to $V_{dd}$ as possible (limited by the working range of the operational amplifier 1301), to minimize the current flow out of $C_e2$ 102 relative to the current flowing through $C_m$ 103. In alternative embodiments, the switches in the converters can be supplied with other known voltages such as, for example, $V_{dd}$.

Figure 16:
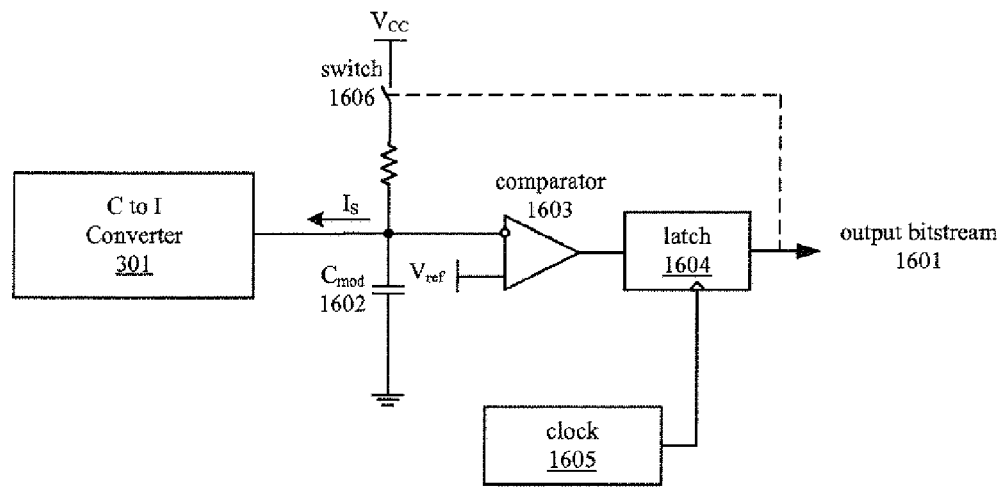
FIG. 16 illustrates one embodiment of a sigma-delta modulator configured as a capacitance to duty cycle converter.

The sigma-delta modulator circuits can be effectively used for the current to code conversion. An advantage of the sigma-delta modulator circuits is their integrative nature. FIG. 16 illustrates one possible example of a modulator implementation for a first order modulator. It should be noted that higher order modulator circuits can be used as well. The sigma-delta modulator of FIG. 16 converts the current $I_S$ to a code in output bitstream 1601. The current $I_S$ discharges modulation capacitor $C_{mod}$ 1602 until the voltage at $C_{mod}$ 1602 falls below $V_{ref}$, at which point comparator 1603 asserts its output to latch 1604, which outputs bits synchronously with a clock signal provided by clock 1605. The latch 1604 then closes switch 1606 to recharge $C_{mod}$ 1602 for the next measurement cycle.

Figure 17:
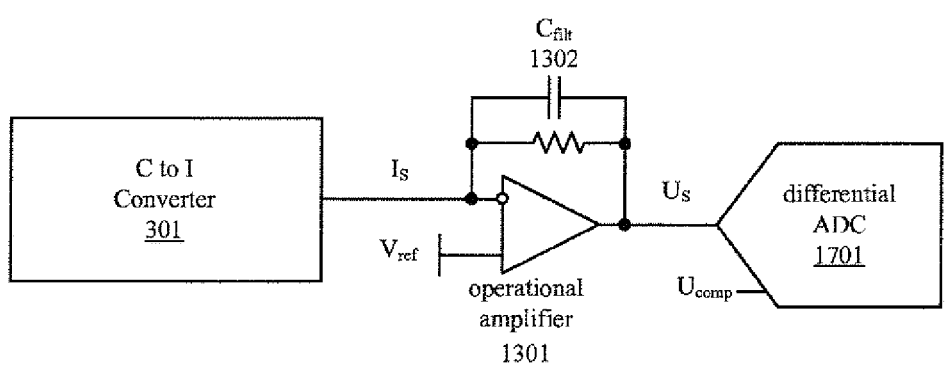
FIG. 17 illustrates one embodiment of a low pass filter with a differential analog to digital converter.

In one embodiment, the capacitance measurement circuit embodiments described above may be used in touch sensitive devices. With such devices, a small capacitance change should be detected over the presence of large base capacitance. Such sensors have two components of capacitance, described in Equation 10 below:

$$C_S = C_{Sconst} + C_{Stouch} \quad (10)$$

where, $C_{Sconst}$ is the capacitance of sensor when touch is absent, and $C_{Stouch}$ is the additional capacitance caused by an input, such as a finger touch. The informative part of the sensor capacitance $C_S$ is the $C_{Stouch}$ component. In order to increase the resolution of the sensor, the particular compensation of the current generated by the $C_{Sconst}$ capacitance can be used. There are several possible implementations of this technique. In one embodiment, an ADC 1701 with differential inputs may be used as illustrated in FIG. 17. In the circuit of FIG. 17, the $U_{comp}$ voltage is supplied to the second input of ADC 1701.

Figure 18A:
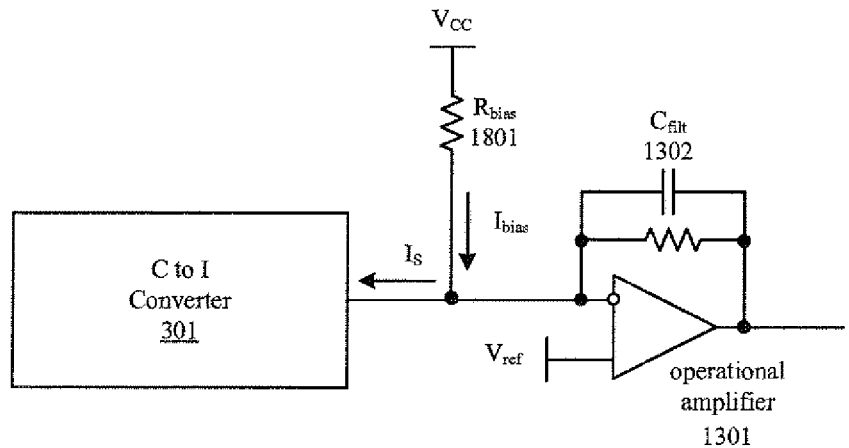
FIG. 18A illustrates base capacitance current compensation using a resistor as a current sink in a capacitance to current converter, according to one embodiment.
Figure 18B:
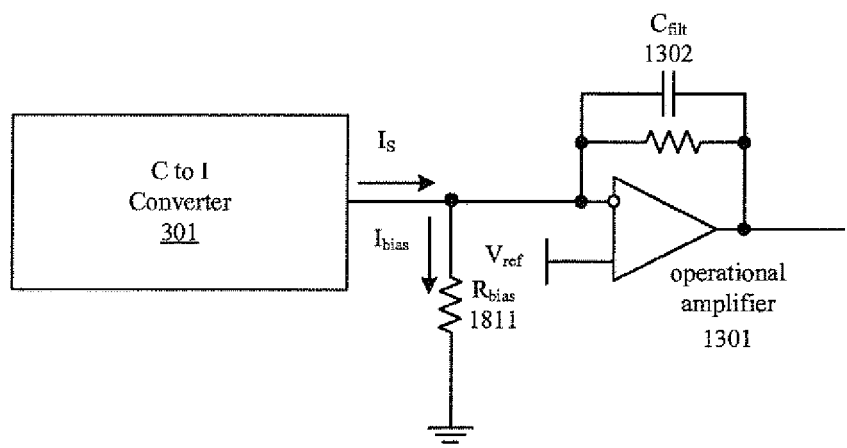
FIG. 18B illustrates base capacitance current compensation using a resistor for a current source in a capacitance to current converter, according to one embodiment.
Figure 19A:
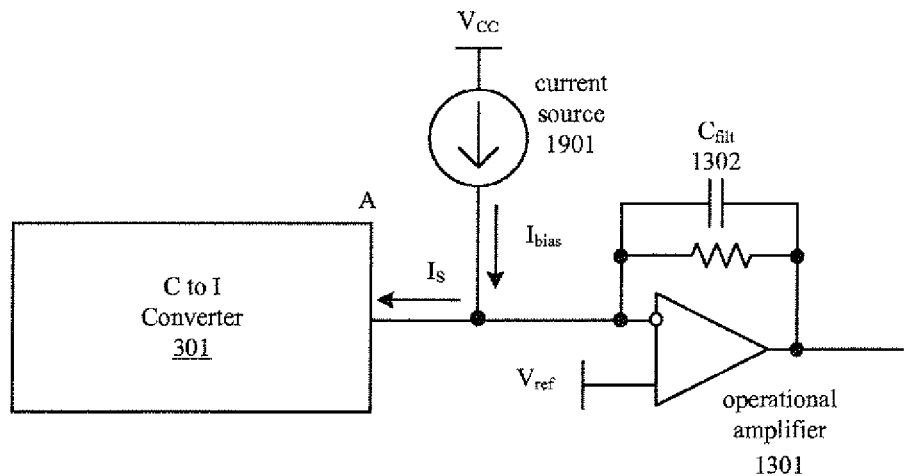
FIG. 19A illustrates base capacitance current compensation using a current source as a current sink in a capacitance to current converter, according to one embodiment.
Figure 19B:
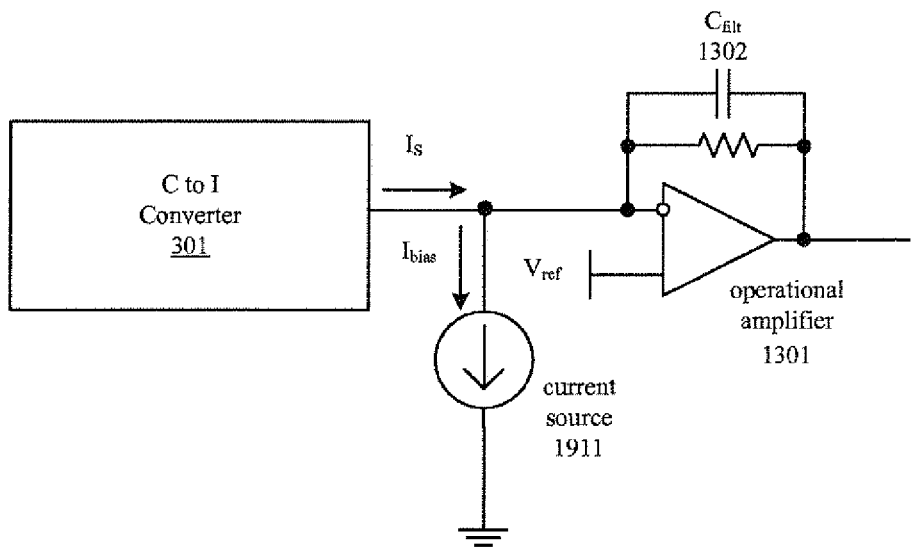
FIG. 19B illustrates base capacitance current compensation using a current source in a capacitance to current converter, according to one embodiment.

Alternative embodiments provide base capacitance current compensation using a programmable current source or a resistor, as illustrated in FIGS. 18A, 18B, 19A, and 19B. More specifically, FIG. 18A illustrates base capacitance current compensation using a resistor $R_{bias}$ 1801 as a current source in a capacitance to current converter, according to one embodiment. FIG. 18B illustrates base capacitance current compensation using a resistor $R_{bias}$ 1811 as a current sink in a capacitance to current converter, according to one embodiment. FIG. 19A illustrates base capacitance current compensation using a current source 1901 as a current sink in a capacitance to current converter, according to one embodiment. FIG. 19B illustrates base capacitance current compensation using a current source 1911 in a capacitance to current converter, according to one embodiment.

The capacitance measurement circuits described herein may be used for touch detection in single electrode systems, transmit/receive (TX-RX) systems, or in combined TX-RX and single electrode systems. The TX-RX systems can use the mutual capacitance change detection, and single electrode systems can use the self capacitance change detection. In some embodiments, additional multiplexers can be added for multiple electrode scanning. The capacitance measurement circuits described herein may be used in various applications including, for example, single button applications, multiple buttons applications, linear and radial sliders, dual dimension touchpads, and multi-touchpad applications. Multi-touchpad systems are composed of a matrix of RX and TX electrodes, where the presence (e.g., touch) of a finger (or other conductive object) is detected as a decrease in the mutual capacitance at the intersection of the TX-RX electrodes.

Figure 20A:
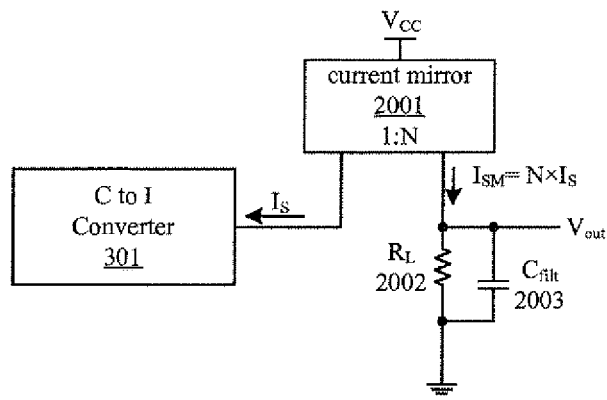
FIG. 20A illustrates using a current mirror with a voltage conversion system, according to one embodiment.
Figure 20B:
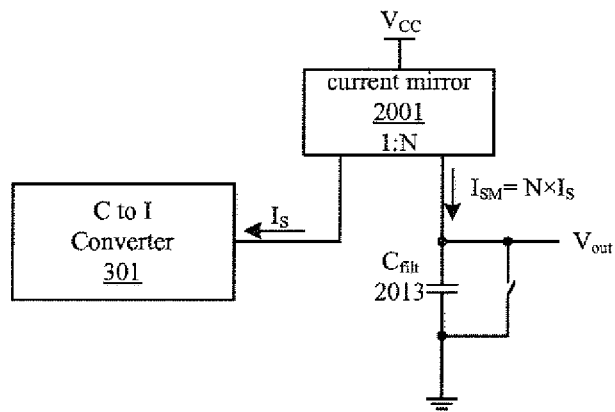
FIG. 20B illustrates using a current mirror with a current conversion system, according to one embodiment.
Figure 20C:
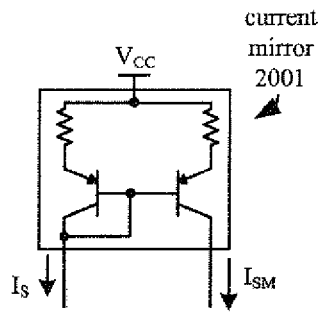
FIG. 20C illustrates one embodiment of a current mirror using a bipolar process technology.

FIGS. 20A, 20B, and 20C illustrate using a current mirror in the conversion circuits. FIG. 20A shows an example of a circuit for current-to-voltage conversion using a low-pass filter, formed by the combination of load resistance $R_L$ 2002 and filter capacitor $C_{filt}$ 2003. A filter output voltage can be measured using an ADC. FIG. 20B illustrates a current-to-current conversion circuit. A current is sourced to the filter capacitor $C_{filt}$ 2013. The different circuits can be used for integration capacitor current measurement. In one embodiment, a current can be measured using a threshold comparator and a timer (not shown). In another embodiment, a filter capacitor voltage is measured using an ADC after running operation within a predefined amount of time. The current mirror has low input impedance, which allows keeping a current mirror input pin voltage close to a constant voltage (e.g. $V_{CC}$). This improves the operating conditions of the capacitance to current conversion circuit, allowing the use of a voltage buffer with a smaller slew rate and reduced current consumption. Also, the current mirror serves as a current amplifier, boosting the converter current by a multiple N. Many implementations of the current mirror circuit are possible, and one implementation is shown at FIG. 20C.

Figure 21:
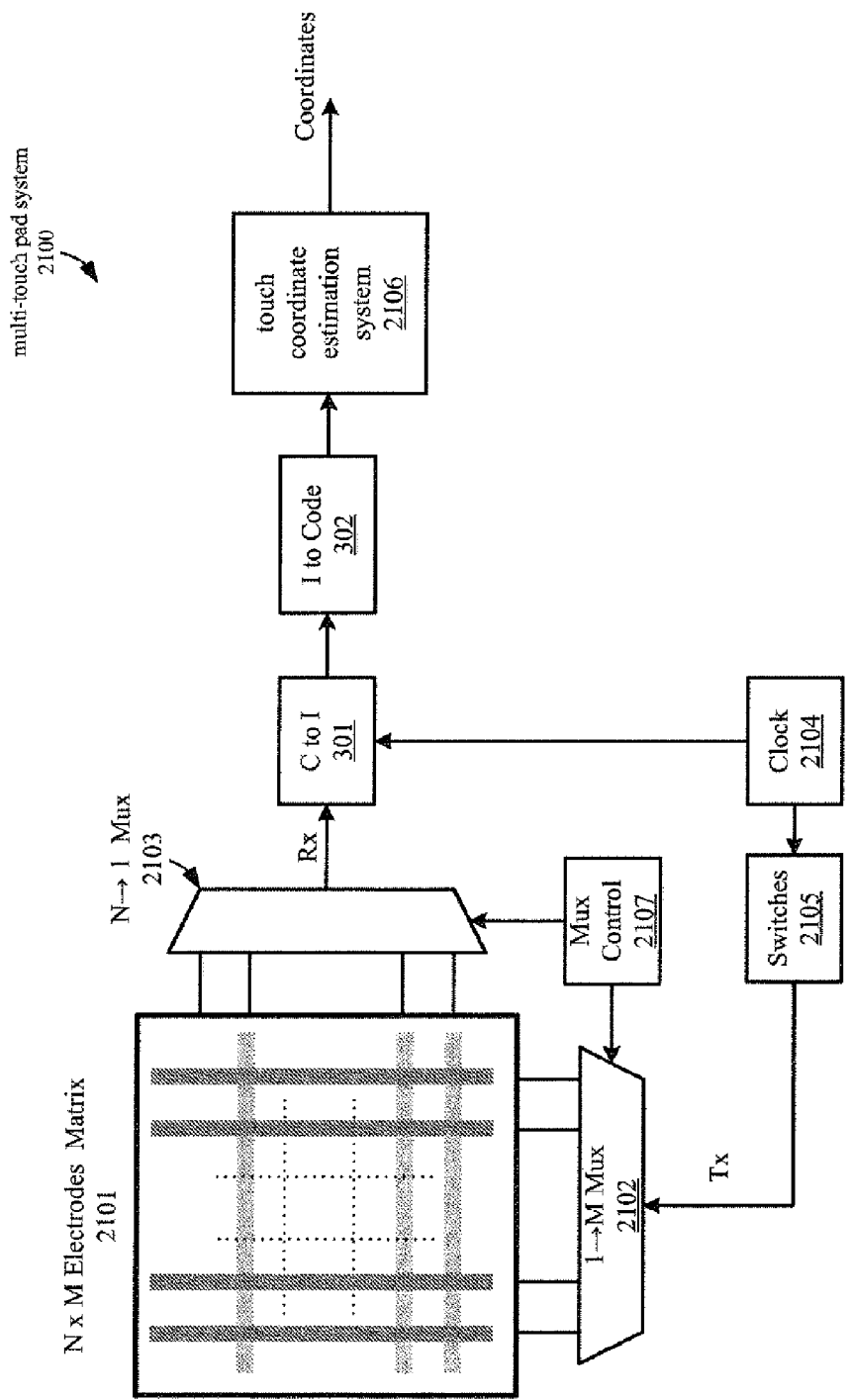
FIG. 21 illustrates one embodiment of a capacitance measurement circuit in a multi-touch touchpad system.

FIG. 21 illustrates a simplified schematic of a multi-touch pad system. The multi-touch pad system 2100 is composed of a dual dimension array (matrix) of electrodes 2101, column and row signal multiplexers 2102 and 2103, multiplexor control 2107, clock source 2104, drive switches 2105, capacitance to current converter 301, current to code converter 302, and touch coordinate estimation system 2106. The electrodes matrix can be fabricated from any conductive material, as copper, conductive ink, Indium Thin Oxide, PEDOT, etc.

Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

The invention claimed is:

1. An apparatus comprising:
    a capacitive sensor comprising a first electrode and a second electrode, wherein the first electrode is configured to have a first self-capacitance and the second electrode is configured to have a second self-capacitance, and wherein the first electrode and the second electrode are configured to have mutual capacitance between them;
    a sensing device including circuitry configured to sense self-capacitance and circuitry configured to sense mutual-capacitance, each configured to detect capacitance values corresponding to whether an object is proximate to a touch screen, wherein the sensing device is configured to measure a first capacitance value from the capacitive sensor using the self-capacitance circuitry during self-capacitance sensing operations and to measure a second capacitance value from the capacitive sensor using the mutual-capacitance circuitry during mutual-capacitance sensing operations;
    wherein the first capacitance value measured during the self-capacitance sensing operations corresponds to the first self-capacitance of the first electrode, and wherein the second capacitance value measured during the mutual-capacitance sensing operations corresponds to the mutual capacitance between the first electrode and the second electrode; and
    wherein, during the self-capacitance sensing operations, the sensing device is configured to set voltages on the first electrode and the second electrode to a same voltage level.

2. The apparatus of claim 1, wherein the sensing device further includes a switching system that is configured to switch to the self-capacitance circuitry to measure the first capacitance value during the self-capacitance sensing operations and to switch to the mutual-capacitance circuitry to measure the second capacitance value during the mutual-capacitance sensing operations.

3. The apparatus of claim 1, wherein the first self-capacitance between the first electrode and a fixed voltage corresponds to the first capacitance value.

4. The apparatus of claim 1, wherein the sensing device further comprises a measurement circuit that is coupled to the self-capacitance circuitry and to the mutual-capacitance circuitry, wherein the measurement circuit is configured to measure the first capacitance value during the self-capacitance sensing operations and to measure the second capacitance value during the mutual-capacitance sensing operations.

5. The apparatus of claim 1, wherein, during mutual-capacitance sensing operations, the sensing device is configured to alternate a voltage level on the first electrode and keep a voltage level on the second electrode constant.

6. The apparatus of claim 1, wherein the sensing device further comprises:
 a voltage source configured to output a voltage for use during capacitive sensing operations; and
 a switching system configured to selectively couple the voltage to the self-capacitance circuitry or the mutual-capacitance circuitry during capacitance sensing operations.

7. The apparatus of claim 1, wherein the sensing device is configured to independently measure the first capacitance value using the self-capacitance circuitry and the second capacitance value using the mutual-capacitance circuitry.

8. The apparatus of claim 1, wherein the sensing device further comprises an integration capacitor coupled to the first electrode, wherein the integration capacitor is used to measure the first self-capacitance of the first electrode.

9. The apparatus of claim 8, wherein the integration capacitor is coupled to a fixed potential net during the mutual-capacitance sensing operations.

10. The apparatus of claim 1, wherein the sensing device is configured to set voltages on the first electrode and the second electrode to the same voltage level during a same stage of the self-capacitance sensing operations.

11. A method comprising:
 selecting a type of capacitance sensing operation to perform with a sensing device that includes a self-capacitance circuitry and a mutual-capacitance circuitry;
 wherein the sensing device is coupled to a capacitive sensor comprising a first electrode and a second electrode, wherein the first electrode is configured to have a first self-capacitance and the second electrode is configured to have a second self-capacitance, and wherein the first electrode and the second electrode are configured to have mutual capacitance between them;
 performing a self-capacitance sensing operation to measure a first capacitance value from the capacitive sensor using the self-capacitance circuitry and performing a mutual-capacitance sensing operation to measure a second capacitance value from the capacitive sensor using the mutual-capacitance circuitry;
 wherein the first capacitance value measured during the self-capacitance sensing operation corresponds to the first self-capacitance of the first electrode, and wherein the second capacitance value measured during the mutual-capacitance sensing operation corresponds to the mutual capacitance between the first electrode and the second electrode; and
 wherein, during the self-capacitance sensing operation, the sensing device is configured to set voltages on the first electrode and the second electrode to a same voltage level.

12. The method of claim 11, wherein each of the first capacitance value and the second capacitance value corresponds to whether an object is proximate to a touch screen.

13. The method of claim 11, further comprising independently measuring the first capacitance value using the self-capacitance circuitry and measuring the second capacitance value using the mutual-capacitance circuitry.

14. The method of claim 11, wherein measuring the first capacitance value using the self-capacitance circuitry is performed when the selected type of capacitance sensing operation is the self-capacitance sensing operation.

15. The method of claim 11, wherein measuring the second capacitance value using the mutual-capacitance circuitry is performed when the selected type of capacitance sensing operation is the mutual-capacitance sensing operation.

16. The method of claim 11, further comprising dynamically switching between performing the self-capacitance sensing operation to measure the first capacitance value using the self-capacitance circuitry and performing the mutual-capacitance sensing operation to measure the second capacitance value using the mutual-capacitance circuitry.

17. The method of claim 11, wherein performing the self-capacitance sensing operation and performing the mutual-capacitance sensing operation comprise using a measurement circuit to measure the first capacitance value during the self-capacitance sensing operation and to measure the second capacitance value during the mutual-capacitance sensing operation.

18. The method of claim 11, wherein performing the self-capacitance sensing operation comprises coupling an integration capacitor to the first electrode.

19. The method of claim 18, wherein performing the mutual-capacitance sensing operation comprises coupling the integration capacitor to a fixed potential net.

20. The method of claim 11, wherein the sensing device is configured to set voltages on the first electrode and the second electrode to the same voltage level during a same stage of the self-capacitance sensing operation.

21. A device comprising:
 a capacitive sensor comprising a first electrode and a second electrode, wherein the first electrode is configured to have a first self-capacitance and the second electrode is configured to have a second self-capacitance, and wherein the first electrode and the second electrode are configured to have mutual capacitance between them;
 a sensing device configured to detect capacitance values corresponding to whether an object is proximate to a touch screen, wherein the sensing device is configured to selectively switch between performing self-capacitance sensing operations to measure a first capacitance value from the capacitive sensor and performing mutual-capacitance sensing operations to measure a second capacitance value from the capacitive sensor;
 wherein the first capacitance value measured during the self-capacitance sensing operations corresponds to the first self-capacitance of the first electrode, and wherein the second capacitance value measured during the mutual-capacitance sensing operations corresponds to the mutual capacitance between the first electrode and the second electrode; and
 wherein, during the self-capacitance sensing operations, the sensing device is configured to set voltages on the first electrode and the second electrode to a same voltage level.

22. The device of claim 21, wherein the sensing device is configured to measure the first capacitance value corresponding to the first self-capacitance between the first electrode and a fixed voltage during self-capacitance sensing operations.

23. The device of claim 21, wherein, during the mutual-capacitance sensing operations, the sensing device is configured to alternate a voltage level on the first electrode and keep a voltage level on the second electrode constant.

24. The device of claim 21, wherein the sensing device is configured to dynamically switch between measuring the first capacitance value in self-capacitance sensing operations and measuring the second capacitance value in mutual-capacitance sensing operations.

25. The device of claim 21, wherein the sensing device is configured to independently measure the first capacitance value using self-capacitance circuitry and the second capacitance value using mutual-capacitance circuitry.

26. The device of claim 21, wherein the sensing device further includes a switching system that is configured to switch to a self-capacitance circuitry to measure the first capacitance value during the self-capacitance sensing operations and to switch to a mutual-capacitance circuitry to measure the second capacitance value during the mutual-capacitance sensing operations.

27. The device of claim 21, wherein the sensing device further comprises a measurement circuit that is coupled to a self-capacitance circuitry and to a mutual-capacitance circuitry, wherein the measurement circuit is configured to measure the first capacitance value during the self-capacitance sensing operations and to measure the second capacitance value during the mutual-capacitance sensing operations.

28. The device of claim 21, wherein the sensing device further comprises an integration capacitor coupled to the first electrode, wherein the integration capacitor is used to measure the first self-capacitance of the first electrode.

29. The device of claim 28, wherein the integration capacitor is coupled to a fixed potential net during the mutual-capacitance sensing operations.

30. The device of claim 21, wherein the sensing device is configured to set voltages on the first electrode and the second electrode to the same voltage level during a same stage of the self-capacitance sensing operations.

* * * * *